(12) United States Patent
Prall et al.

(10) Patent No.: US 8,441,056 B2
(45) Date of Patent: May 14, 2013

(54) NROM MEMORY CELL, MEMORY ARRAY, RELATED DEVICES AND METHODS

(75) Inventors: Kirk D. Prall, Boise, ID (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 416 days.

(21) Appl. No.: 12/795,906

(22) Filed: Jun. 8, 2010

(65) Prior Publication Data

US 2010/0244117 A1  Sep. 30, 2010

Related U.S. Application Data

(60) Continuation of application No. 11/346,421, filed on Feb. 2, 2006, now Pat. No. 7,750,389, which is a division of application No. 10/738,408, filed on Dec. 16, 2003, now Pat. No. 7,220,634, which is a continuation-in-part of application No. 10/177,211, filed on Jun. 21, 2002, now abandoned, and a continuation-in-part of application No. 10/232,411, filed on Aug. 29, 2002, now abandoned.

(51) Int. Cl.
*H01L 29/72* (2006.01)

(52) U.S. Cl.
USPC ........... 257/302; 257/310; 257/324; 257/330; 365/185.03; 365/185.24

(58) Field of Classification Search ............... 257/302, 257/310, 324, 330; 365/185.03, 185.24
See application file for complete search history.

(56) References Cited

U.S. PATENT DOCUMENTS

| 4,184,207 A | 1/1980 | McElroy |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |

(Continued)

FOREIGN PATENT DOCUMENTS

| EP | 84303740.9 | 1/1985 |
| EP | 90115805.5 | 2/1991 |
| EP | 01113179.4 | 12/2002 |

OTHER PUBLICATIONS

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

(Continued)

*Primary Examiner* — Edward Wojciechowicz
(74) *Attorney, Agent, or Firm* — Leffert Jay & Polglaze, P.A.

(57) ABSTRACT

An array of memory cells configured to store at least one bit per one $F^2$ includes substantially vertical structures providing an electronic memory function spaced apart a distance equal to one half of a minimum pitch of the array. The structures providing the electronic memory function are configured to store more than one bit per gate. The array also includes electrical contacts to the memory cells including the substantially vertical structures. The cells can be programmed to have one of a number of charge levels trapped in the gate insulator adjacent to the first source/drain region such that the channel region has a first voltage threshold region (Vt1) and a second voltage threshold region (Vt2) and such that the programmed cell operates at reduced drain source current.

19 Claims, 16 Drawing Sheets

U.S. PATENT DOCUMENTS

| | | |
|---|---|---|
| 5,330,930 A | 7/1994 | Chi |
| 5,341,328 A | 8/1994 | Ovshinsky |
| 5,378,647 A | 1/1995 | Hong |
| 5,379,253 A | 1/1995 | Bergemont |
| 5,386,132 A * | 1/1995 | Wong .................. 257/316 |
| 5,397,725 A | 3/1995 | Wolstenholme |
| 5,406,509 A | 4/1995 | Ovshinsky |
| 5,467,305 A | 11/1995 | Bertin |
| 5,576,236 A | 11/1996 | Chang |
| 5,610,099 A | 3/1997 | Stevens |
| 5,617,351 A | 4/1997 | Bertin |
| 5,768,192 A | 6/1998 | Eitan |
| 5,792,697 A | 8/1998 | Wen |
| 5,858,841 A | 1/1999 | Hsu |
| 5,892,710 A | 4/1999 | Fazio |
| 5,911,106 A | 6/1999 | Tasaka |
| 5,936,274 A | 8/1999 | Forbes |
| 5,946,558 A | 8/1999 | Hsu |
| 5,966,603 A | 10/1999 | Eitan |
| 5,973,356 A | 10/1999 | Noble |
| 5,990,509 A | 11/1999 | Burns |
| 5,991,225 A | 11/1999 | Forbes |
| 5,994,745 A | 11/1999 | Hong |
| 6,011,725 A | 1/2000 | Eitan |
| 6,028,342 A | 2/2000 | Chang |
| 6,030,871 A | 2/2000 | Eitan |
| 6,044,022 A | 3/2000 | Nachumovsky |
| 6,072,209 A | 6/2000 | Noble |
| 6,081,456 A | 6/2000 | Dadashev |
| 6,093,606 A | 7/2000 | Lin |
| 6,108,240 A | 8/2000 | Lavi |
| 6,114,725 A | 9/2000 | Furukawa |
| 6,124,729 A | 9/2000 | Noble |
| 6,133,102 A | 10/2000 | Wu |
| 6,134,156 A | 10/2000 | Eitan |
| 6,144,093 A | 11/2000 | Davis |
| 6,147,904 A | 11/2000 | Liron |
| 6,150,687 A | 11/2000 | Noble |
| 6,157,570 A | 12/2000 | Nachumovsky |
| 6,172,396 B1 | 1/2001 | Chang |
| 6,174,758 B1 | 1/2001 | Nachumovsky |
| 6,175,523 B1 | 1/2001 | Yang |
| 6,181,597 B1 | 1/2001 | Nachumovsky |
| 6,184,089 B1 | 2/2001 | Chang |
| 6,201,282 B1 | 3/2001 | Eitan |
| 6,201,737 B1 | 3/2001 | Hollmer |
| 6,204,529 B1 | 3/2001 | Lung |
| 6,207,504 B1 | 3/2001 | Hsieh |
| 6,208,557 B1 | 3/2001 | Bergemont |
| 6,215,702 B1 | 4/2001 | Derhacobian |
| 6,218,695 B1 | 4/2001 | Nachumovsky |
| 6,222,768 B1 | 4/2001 | Hollmer |
| 6,240,020 B1 | 5/2001 | Yang |
| 6,243,300 B1 | 6/2001 | Sunkavalli |
| 6,251,731 B1 | 6/2001 | Wu |
| 6,255,166 B1 | 7/2001 | Ogura |
| 6,256,231 B1 | 7/2001 | Lavi |
| 6,266,281 B1 | 7/2001 | Derhacobian |
| 6,269,023 B1 | 7/2001 | Derhacobian |
| 6,272,043 B1 | 8/2001 | Hollmer |
| 6,275,414 B1 | 8/2001 | Randolph |
| 6,282,118 B1 | 8/2001 | Lung |
| 6,291,854 B1 | 9/2001 | Peng |
| 6,297,096 B1 | 10/2001 | Boaz |
| 6,303,436 B1 | 10/2001 | Sung |
| 6,303,479 B1 | 10/2001 | Snyder |
| 6,320,223 B1 | 11/2001 | Hueting |
| 6,327,174 B1 | 12/2001 | Jung |
| 6,331,467 B1 | 12/2001 | Brown |
| 6,348,711 B1 | 2/2002 | Eitan |
| 6,392,930 B2 | 5/2002 | Jung |
| 6,417,053 B1 | 7/2002 | Kuo |
| 6,421,275 B1 | 7/2002 | Chen |
| 6,429,063 B1 | 8/2002 | Eitan |
| 6,432,778 B1 | 8/2002 | Lai |
| 6,461,949 B1 | 10/2002 | Chang |
| 6,468,864 B1 | 10/2002 | Sung |
| 6,469,342 B1 | 10/2002 | Kuo |
| 6,477,084 B1 | 11/2002 | Eitan |
| 6,486,028 B1 * | 11/2002 | Chang et al. .................. 438/259 |
| 6,487,050 B1 | 11/2002 | Liu |
| 6,498,377 B1 | 12/2002 | Lin |
| 6,514,831 B1 | 2/2003 | Liu |
| 6,531,887 B2 | 3/2003 | Sun |
| 6,541,815 B1 | 4/2003 | Mandelman |
| 6,545,309 B1 | 4/2003 | Kuo |
| 6,552,387 B1 | 4/2003 | Eitan |
| 6,559,013 B1 | 5/2003 | Pan |
| 6,576,511 B2 | 6/2003 | Pan |
| 6,580,135 B2 | 6/2003 | Chen |
| 6,580,630 B1 | 6/2003 | Liu |
| 6,602,805 B2 | 8/2003 | Chang |
| 6,607,957 B1 | 8/2003 | Fan |
| 6,610,586 B1 | 8/2003 | Liu |
| 6,613,632 B2 | 9/2003 | Liu |
| 6,617,204 B2 | 9/2003 | Sung |
| 6,660,590 B2 | 12/2003 | Yoo |
| 6,670,246 B1 | 12/2003 | Hsiao |
| 2001/0001075 A1 | 5/2001 | Ngo |
| 2001/0004332 A1 | 6/2001 | Eitan |
| 2001/0011755 A1 | 8/2001 | Tasaka |
| 2002/0142569 A1 | 10/2002 | Chang |
| 2002/0146885 A1 | 10/2002 | Chen |
| 2002/0151138 A1 | 10/2002 | Liu |
| 2002/0177275 A1 | 11/2002 | Liu |
| 2002/0182829 A1 | 12/2002 | Chen |
| 2003/0057997 A1 | 3/2003 | Sun |
| 2003/0067807 A1 | 4/2003 | Lin |
| 2003/0117861 A1 | 6/2003 | Maayan |
| 2003/0235075 A1 | 12/2003 | Forbes |
| 2004/0031984 A1 | 2/2004 | Kianian |
| 2004/0066672 A1 | 4/2004 | Forbes |

OTHER PUBLICATIONS

S. Ogura, et al. "Twin MONOS Cell with Dual Control Gates," Halo LSI and New Halo, pp. 187-187.3, Date Unknown.

T. Sugizaki, et al. "New 2-bit/Tr MONOS Type Flash Memory using $Al_2O_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-179-01-722, Copyright 2001 IEEE.

R. Neale, "AMD's MirrorBit—a big step in Flash progress," Electronic Engineering Design, vol. 74, No. 906, pp. 47-50.

I. Bloom, et al., "NROM™—a new technology for non-volatile memory products" Solid-State Electronics 46 (2002), pp. 1757-1763. Copyright 2002 Elsevier Science Ltd.

R. Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.

J. Jang et al., "Vertical Cell Array using TCAT (Terabit Cell Array Transistor) Technology for Ultra High Density NAND Flash Memory," 2009 Symposium on VLSI Technology Digest of Technical Papers, pp. 192-193.

W. Kim et al, "Multi-Layered Vertical Gate NAND Flash Overcoming Stacking Limit for Terabit Density Storage," 2009 Symposium on VLSI Technology Digest of Technical Papers, pp. 188-189.

M. Ishiduki et al. "Optimal Device Structure for Pipe-shaped BiCS Flash Memory for Ultra High Density Storage Device with Excellent Performance and Reliability," Copyright 2009 IEEE, pp. 27.3.1-27.3.4.

A. Nughin, "n-Channel 256kb and 1Mb EEPROMs," ISSCC91, Session 134, Special Session on Technology in the USSR, Paper 13.4, 1991 IEEE International Solid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, et al., "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in microFLASH® Memory Cells," Tower Semiconductor, Ltd., Date Unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Date Unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of microFLASH® Memory (Activation Energy of Traps in the ONO Stack)," Tower Semiconductor, Ltd., Date Unknown.

Y. Roizin, et al., "Activation Energy of Traps in the ONO Stack of microFLASH® Memory Cells," Tower Semiconductor, Ltd., Date Unknown.

Y. Roizin, et al., "'Dummy' Gox for Optimization of microFLASH® Technology," Tower Semiconductor, Ltd., Date Unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

T. Schulz, et al., "Short-Channel Vertical sidewall MOSFETs," © 2001 IEEE, pp. 1783-1788.

Versari, et al., "Optimized programming of Multilevel Flash EEPROMs," © 2001 IEEE, pp. 1641-1646.

Standards Committee of the IEEE Electron Devices Society, "IEEE Standard Definitions and Characterization of Floating Gate Semiconductor Arrays," © 1999 IEEE, cover page and pp. 46-52.

Von Houdt, et al., "Analysis of the Enhanced Hot-Electron Injection in Split-Gate Transistors Useful for EEPROM Applications," © 1992 IEEE, pp. 1150-1156.

Milnes, D.Sc., A.G., "Semiconductor Devices and Integrated Electronics," © 1980 by A.G. Milnes, 3 pp.

B. Dipert and L. Hebert, "Flash Memory goes Mainstream," IEEE Spectrum, No. 10, pp. 48-52, (Oct. 1993).

S.A. Abbas and R.C. Dockerty, DialogTech, "N-channel IGFET design limitations dude to hot electron trapping," IEEE Int. Electron Devices Mtg., Washington D.C., (Dec. 1975), pp. 35-38, Dialog® File No. 2 Accession No. 956925.

L. Forbes, E. Sun, R. Alders and J. Moll, DialogTech, "Field induced re-emission of electons trapped in $SiO_2$," IEEE Trans. Electron Device, vol. ED-26, No. 11, pp. 1816-1818 (Nov. 1979), Dialog® File No. 2 Accession No. 1543221.

B. Eitan et al., "Impact of Programming Charge Distribution on Threshold Voltage and Subthreshold Slope of NROM Memory cells," IEEE Transactions on Election Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

Y. Roizin, et al. "Novel Techniques for data retention and Leff measurements in two bit MicroFlash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Animal International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-941. Copyright 2003 Elsevier Science Ltd.

I. Bloom, et al., "NROM™—a new technology for non-volatile memory products" Solid-State Electronics 46 (2002). pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. MinaMi, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

S. Ogura, et al. "Twin MONOS Cell with Dual Control Gates," Halo LSI and New Halo, pp. 187-187.3, published at least as early as Dec. 15, 2003.

T. Sugizaki, et al. "New 2-bit/Tr MONOS Type Flash Memory using $Al_2O_3$ as Charge Trapping Layer," Fujitsu Laboratories Ltd, published at least as early as Dec. 15, 2003.

T. Saito, et al. "Hot Hole Erase Characteristics and Reliability in Twin MONOS Device" Halo LSI, published at least as early as Dec. 15, 2003.

Saifun Semiconductors, Ltd. PowerPoint Presentation, published at least as early as Dec. 15, 2003.

R. Neale, "AMD's MirrorBit—a big step in Flash progress," Electronic Engineering Design, V. 74, No. 906, pp. 47-50, published at least as early as Dec. 15, 2003.

* cited by examiner $C_{ox} = \dfrac{1.06 \times 10^{-12}}{3 \times 6.7 \times 10^{-7}} = 0.5 \times 10^{-6} \text{ F/cm}^2$ $C_{ox} = 0.5 \times 10^{-6} \text{ F/cm}^2 \times 2 \times 10^{-11} \text{cm}^2$
$= 10^{-17} \text{F}$ $\Delta V = 1.6\text{V} \quad Q = C\Delta V = 1.6 \times 10^{-17} \text{ COULOMBS}$
$Q = Nq$ $N = \dfrac{160 \times 10^{-19} \text{ COULOMBS}}{1.6 \times 10^{-19} \text{ COULOMBS}} = \dfrac{160}{1.6} = 100 \text{ ELECTRONS}$

NROM MEMORY CELL, MEMORY ARRAY, RELATED DEVICES AND METHODS

RELATED APPLICATIONS

This application is a Continuation of U.S. application Ser. No. 11/346,421, titled "NROM MEMORY CELL, MEMORY ARRAY, RELATED DEVICES AND METHODS," filed on Feb. 2, 2006, now U.S. Pat. No. 7,750,389, issued Jul. 6, 2012, which is a Divisional of U.S. application Ser. No. 10/738,408, now U.S. Pat. No. 7,220,634, filed Dec. 16, 2003 and issued on May 22, 2007, which is a continuation-in-part of U.S. application Ser. No. 10/177,211, filed on Jun. 21, 2002, now abandoned, and a continuation-in-part of U.S. application Ser. No. 10/232,411, filed on Aug. 29, 2002, now abandoned which are all commonly assigned and incorporated herein by reference in their entirety.

TECHNICAL FIELD

This invention relates to a NROM memory cells, arrays of such memory cells, electronic devices employing such memory cells and arrays, and methods related to such memory cells.

BACKGROUND

Various types of memory devices are used in electronic systems. Some types of memory device, such as DRAM (dynamic random access memory) provide large amounts of readable and writable data storage with modest power budget and in favorably small form factor, but are not as fast as other types of memory devices and provide volatile data storage capability. Volatile data storage means that the memory must be continuously powered in order to retain data, and the stored data are lost when the power is interrupted. Nonvolatile memories are capable of retaining data without requiring electrical power.

Other types of memory can provide read-only or read-write capabilities and non-volatile data storage, but are much slower in operation. These include CD-ROM devices, CD-WORM devices, magnetic data storage devices (hard discs, floppy discs, tapes and so forth), magneto-optical devices and the like.

Still other types of memory provide very high speed operation but also demand high power budgets. Static RAM or SRAM is an example of such memory devices.

In most computer systems, different memory types are blended to selectively gain the benefits that each technology can offer. For example, read-only memories or ROM, EEPROM and the like are typically used to store limited amounts of relatively infrequently-accessed data such as a basic input-output system. These memories are employed to store data that, in response to a power ON situation, configure a processor to be able to load larger amounts of software such as an operating system from a high capacity non-volatile memory device such as a hard drive. The operating system and application software are typically read from the high capacity memory and corresponding images are stored in DRAM.

As the processor executes instructions, some types of data may be repeatedly fetched from memory. As a result, some SRAM or other high speed memory is typically provided as "cache" memory in conjunction with the processor and may be included on the processor integrated circuit or chip and/or very near it.

Several different kinds of memory device are involved in most modern computing devices, and in many types of appliances that include automated and/or programmable features (home entertainment devices, telecommunications devices, automotive control systems etc.). As system and software complexity increase, need for additional memory increases. Desire for portability, computation power and/or practicality result in increased pressure to reduce both power consumption and circuit area per bit.

DRAMs have been developed to very high capacities in part because the memory cells can be manufactured to have a very small area, and the power draw per cell can also be made quite small. In turn, this allows memory integrated circuits to be made that incorporate millions of memory cells in each chip. Typical one-transistor, one-capacitor DRAM memory cells can be produced to have extremely small areal requirements.

Such areas are often equal to about 3F×2F, or less, where "F" is defined as equal to one-half of minimum pitch (see FIG. 4, infra). Minimum pitch (i.e., "P") is defined as equal to the smallest distance of a line width (i.e., "W") plus width of a space immediately adjacent the line on one side of the line between the line and a next adjacent line in a repeated pattern within the array (i.e., "S"). Thus, in many implementations, the consumed area of a given DRAM cell is no greater than about $8F^2$.

However, because DRAMs are volatile memory devices, they require "refresh" operations. In a refresh operation, data are read out of each memory cell, amplified and written back into the DRAM. As a first result, the DRAM circuit is usually not available for other kinds of memory operations during the refresh operation. Additionally, refresh operations are carried out periodically, resulting in times during which data cannot be readily extracted from or written to DRAMs. As a second result, some amount of electrical power is always needed to store data in DRAM devices.

As a third result, boot operations for computers such as personal computers involve a period during which the computer cannot be used following power ON initiation. During this period, operating system instructions and associated data, and application instructions and associated data, are read from relatively slow, non-volatile memory, such as a conventional disc drive, are decoded by the processing unit and the resultant instructions and associated data are loaded into modules incorporating relatively rapidly-accessible, but volatile, memory such as DRAM. Other consequences flow from the properties of the memory systems included in various electronic devices and the increasingly complex software employed with them, however, these examples serve to illustrate ongoing needs.

Needed are methods and apparatus relating to non-volatile memory providing high areal data storage capacity, reprogrammability, low power consumption and relatively high data access speed.

BRIEF DESCRIPTION OF THE DRAWINGS

Embodiments of the invention are described below with reference to the following accompanying drawings.

DETAILED DESCRIPTION

Figure 1:
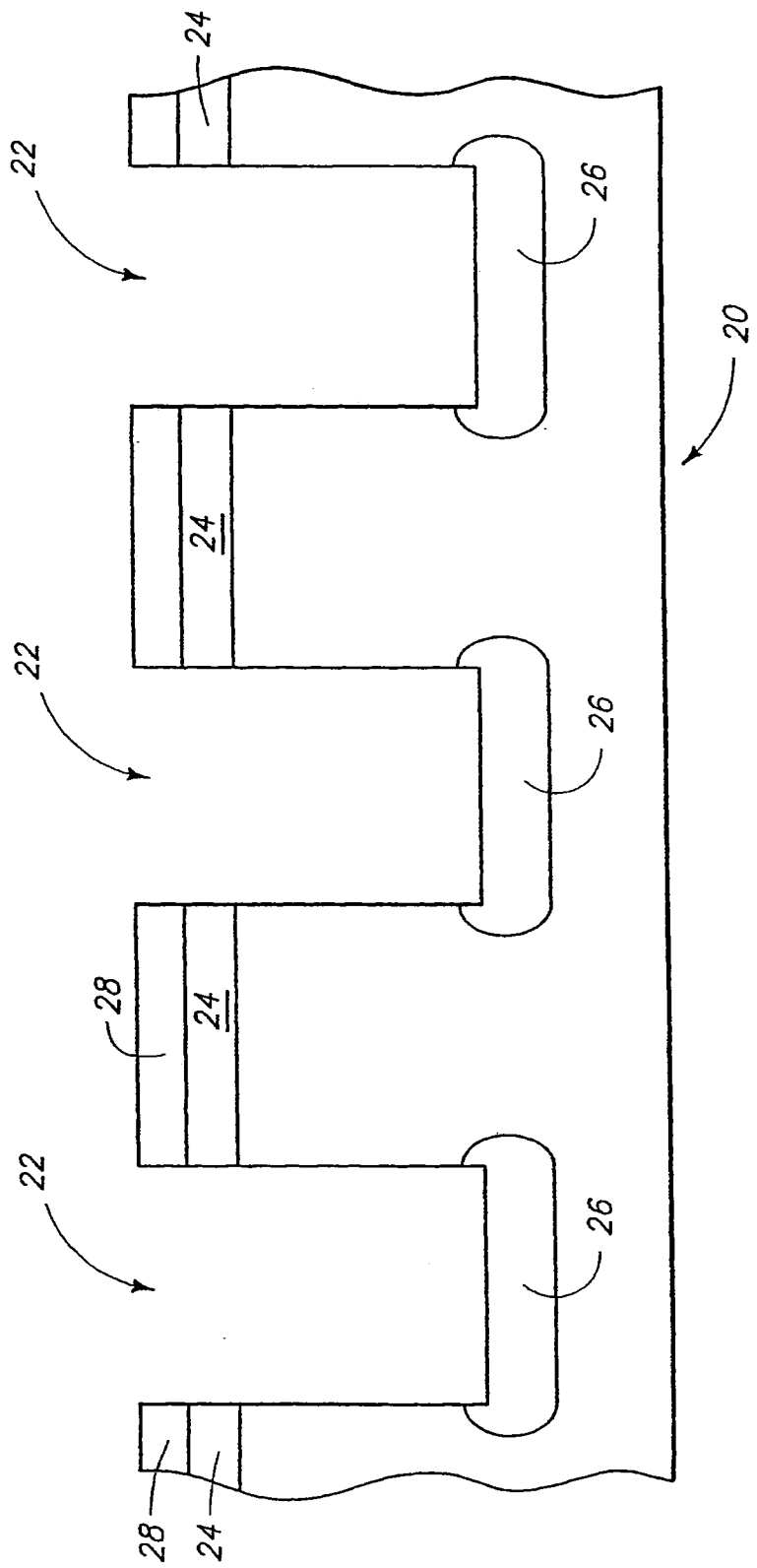
FIG. 1 is a simplified side view, in section, of a semiconductor substrate portion at one stage in processing, in accordance with an embodiment of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors.

FIG. 1 is a simplified side view, in section, of a semiconductor substrate portion 20 at one stage in processing, in accordance with an embodiment of the present invention. The portion 20 includes etched or incised recesses 22, doped regions 24 and 26 and caps 28. The etched recesses 22 form trenches extending along an axis into and out of the page of FIG. 1.

In one embodiment, the doped regions 24 are implanted n+ regions. In one embodiment, the doped regions 24 are formed by a blanket implant. In one embodiment, the caps 28 are dielectric caps and may be formed using conventional silicon nitride and conventional patterning techniques. In one embodiment, the etched recesses 22 are then etched using conventional plasma etching techniques. In one embodiment, the doped regions 26 are then doped by implantation to form n+ regions. The etched or incised recesses 22 may be formed by plasma etching, laser-assisted techniques or any other method presently known or that may be developed. In one embodiment, the recesses 22 are formed to have substantially vertical sidewalls relative to a top surface of the substrate portion 20. In one embodiment, substantially vertical means at 90 degrees to the substrate surface, plus or minus ten degrees.

Figure 2:
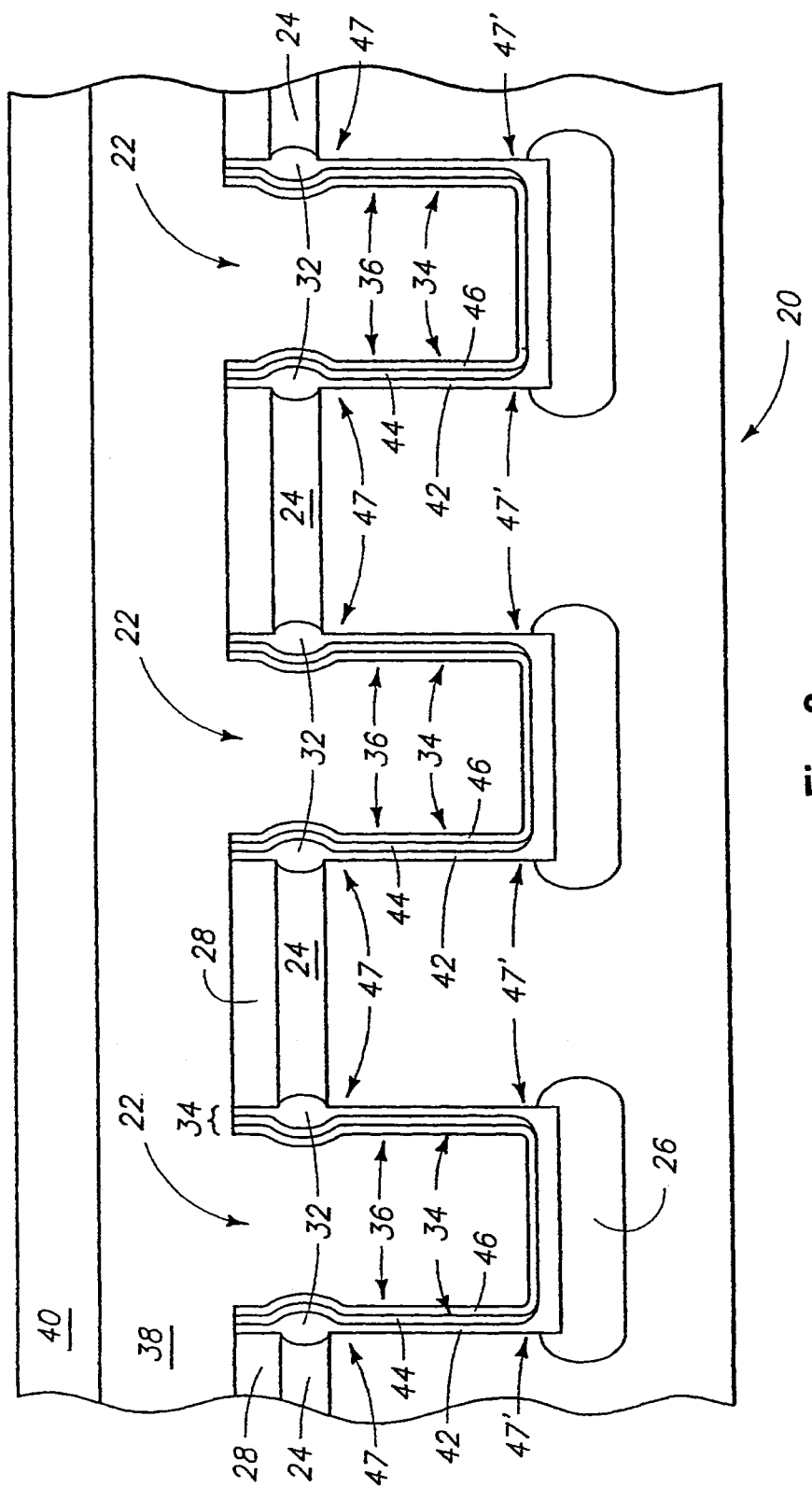
FIG. 2 is a simplified side view, in section, of the substrate portion of FIG. 1 at a later stage in processing, in accordance with an embodiment of the present invention.

FIG. 2 provides a simplified side view, in section, of the substrate portion 20 of FIG. 1 at a later stage in processing, in accordance with an embodiment of the present invention. The portion 20 of FIG. 2 includes thick oxide regions 32, ONO regions 34 formed on sidewalls 36 of the recesses 22, gate material 38 and a conductive layer 40. In one embodiment, the gate material 38 comprises conductively-doped polycrystalline silicon.

In one embodiment, conventional techniques are employed to oxidize the doped regions 24 and 26 preferentially with respect to sidewalls 36. As a result, the thick oxide regions 32 are formed at the same time as a thinner oxide 42 on the sidewalls 36. These oxides also serve to isolate the doped regions 24 and 26 from what will become transistor channels along the sidewalls 36. Other techniques for isolation may be employed. For example, in one embodiment, high density plasma grown oxides may be employed. In one embodiment, spacers may be employed.

In one embodiment, conventional techniques are then employed to provide a nitride layer 44 and an oxide layer 46, as is described, for example, in "NROM: A Novel Localized Trapping, 2-Bit Nonvolatile Memory Cell", by Boaz Eitan et al., IEEE Electron Device Letters, Vol. 21, No. 11, November 2000, pp. 543-545, IEEE Catalogue No. 0741-3106/00, or in "A True Single-Transistor Oxide-Nitride-Oxide EEPROM Device" by T. Y. Chan et al., IEEE Electron Device Letters, Vol. EDL-8, No. 3, March, 1987, pp. 93-95, IEEE Catalogue No. 0741-3106/87/0300-0093.

In one embodiment, the thin oxide 42, nitride layer 44 and oxide layer 46 combine to form the ONO layer 34, such as is employed in SONOS devices, while the polysilicon 38 forms a control gate. In operation, application of suitable electrical biases to the doped regions 24, 26 and the control gate 38 cause hot majority charge carriers to be injected into the nitride layer 44 and become trapped, providing a threshold voltage shift and thus providing multiple, alternative, measurable electrical states representing stored data. "Hot" charge carriers are not in thermal equilibrium with their environment. In other words, hot charge carriers represent a situation where a population of high kinetic energy charge carriers exist. Hot charge carriers may be electrons or holes.

SONOS devices are capable of storing more than one bit per gate 38. Typically, the hot carriers are injected into one side 47 or 47' of the ONO layer 34, adjacent a contact, such as the region 24 or the region 26, that provides a high electrical field.

By reversing the polarity of the potentials applied to the regions 24 and 26, charge may be injected into the other side 47' or 47 of the ONO layer 34. Thus, four electronically-discriminable and distinct states can be easily provided with a single gate 38. As a result, the structure shown in FIG. 2 is capable of storing at least four bits per gate 38.

Figure 3:
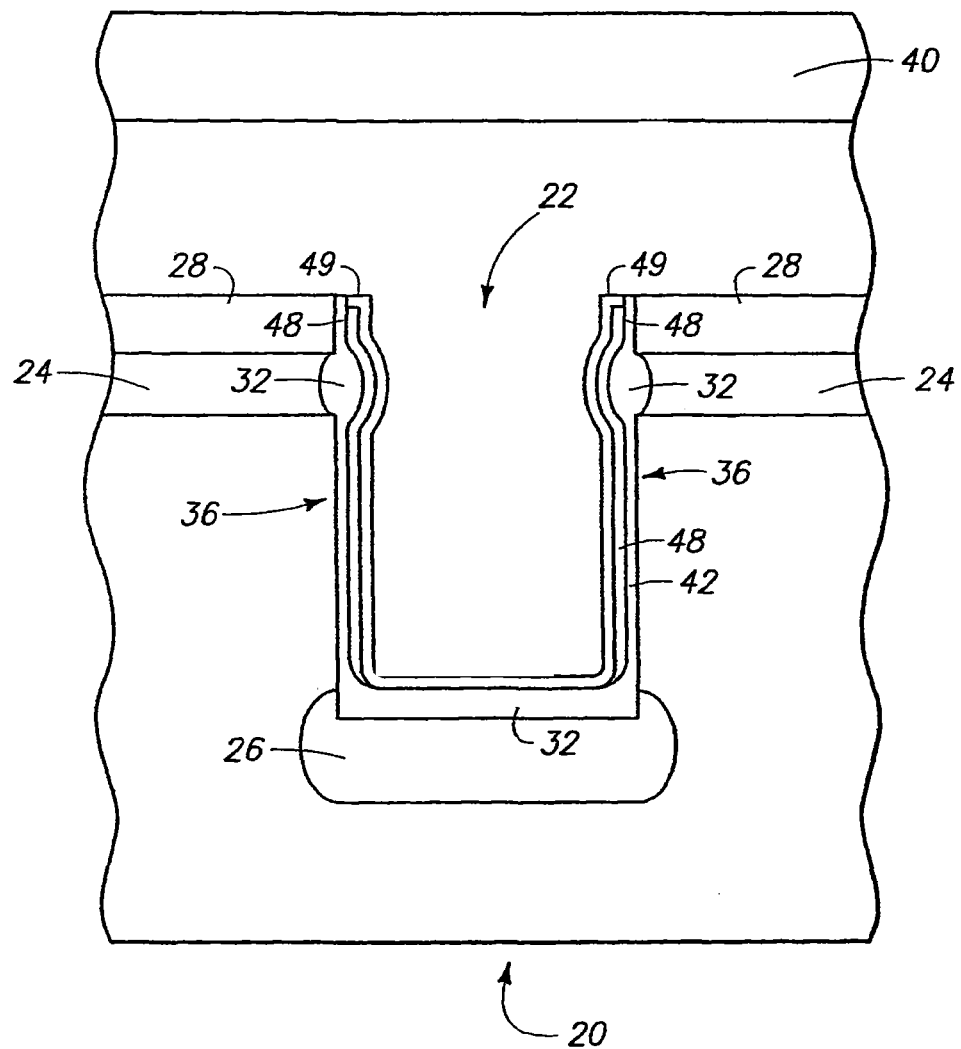
FIG. 3 is a simplified side view, in section, of the substrate portion of FIG. 2 at a later stage in processing, in accordance with an embodiment of the present invention.

FIG. 3 is a simplified side view, in section, of the substrate portion 20 of FIG. 1 at an alternative stage in processing, in accordance with an embodiment of the present invention. The embodiment shown in FIG. 3 includes the oxide regions 32 and 42, but a floating gate 48 is formed on the thin oxide region 42. A conventional oxide or nitride insulator 49 is formed on the floating gate 48, followed by deposition of gate material 38. Floating gate devices are known and operate by injecting hot charge carriers, which may comprise electrons or holes, into the floating gate 48.

Floating gate devices can be programmed to different charge levels that can be electrically distinct and distinguishable. As a result, it is possible to program more data than one bit into each floating gate device, and each externally addressable gate 38 thus corresponds to more than one stored bit. Typically, charge levels of 0, Q, 2Q and 3Q might be employed, where Q represents some amount of charge corresponding to a reliably-distinguishable output signal.

Figure 4:
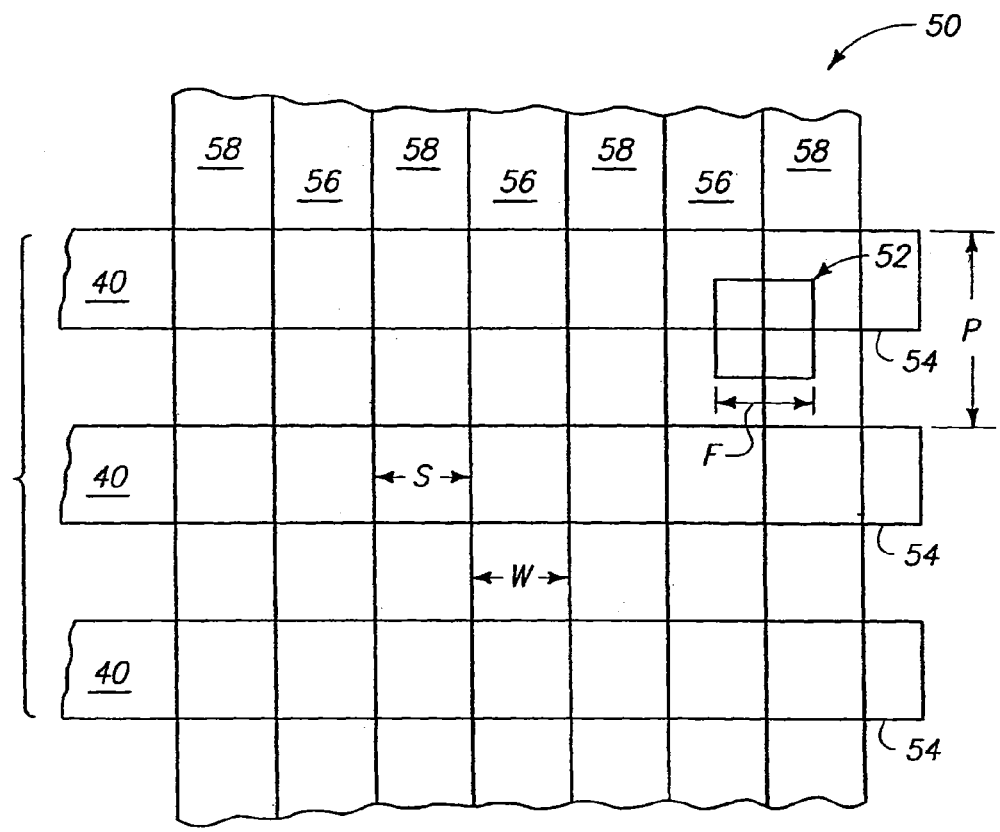
FIG. 4 is a simplified plan view of a substrate portion showing a portion of a memory cell array, in accordance with an embodiment of the present invention.

FIG. 4 is a simplified plan view of a substrate portion showing a portion of a memory cell array 50, in accordance with an embodiment of the present invention. FIG. 4 also provides examples of pitch P, width W, space S and minimum feature size F, as described in the Background. An exemplary memory cell area 52, the physical area of a single transistor, can be seen to be about one $F^2$. Wordlines 54 are formed from the conductive layer 40, and bitlines 56 and 58 are formed.

Figure 5:
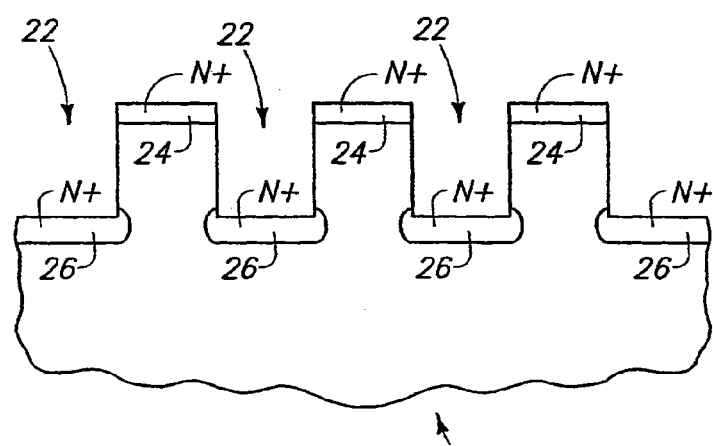
FIG. 5 is a simplified side view, in section, illustrating a relationship between the structures of FIGS. 1-3 and the plan view of FIG. 4, in accordance with an embodiment of the present invention.

FIG. 5 is a simplified side view, in section, illustrating a relationship between the structures of FIGS. 1-3 and the plan view of FIG. 4, in accordance with an embodiment of the present invention. The trenches 22 correspond to bitlines 56 and 58, as is explained below in more detail with reference to FIGS. 6-8.

The density of memory arrays such as that described with reference to FIGS. 1-5 can require interconnection arrangements that differ from prior art memory arrays. One embodiment of a new type of interconnection arrangement useful with such memory systems is described below with reference to FIGS. 6-8.

Figure 6:
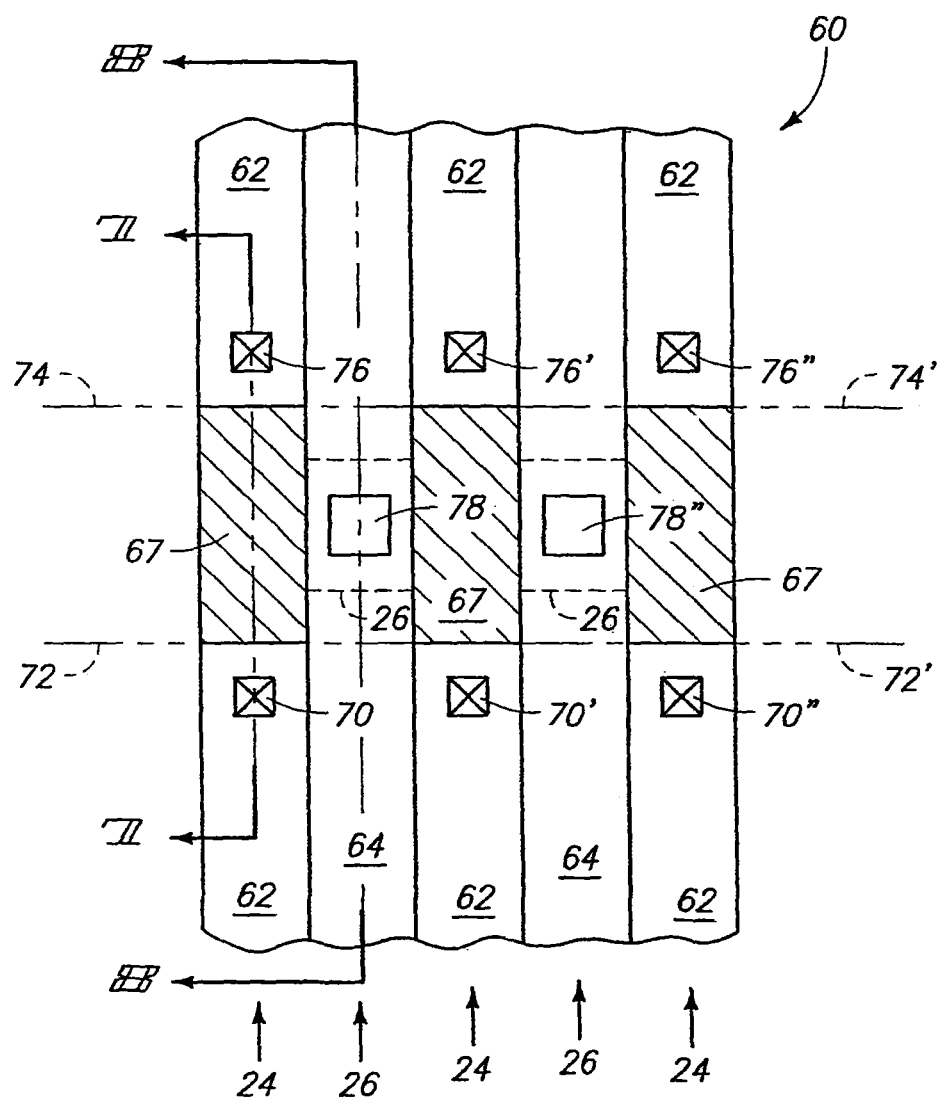
FIG. 6 is a simplified plan view of a memory cell array illustrating an interconnection arrangement for the memory cell array of FIG. 4, in accordance with an embodiment of the present invention.
Figure 7:
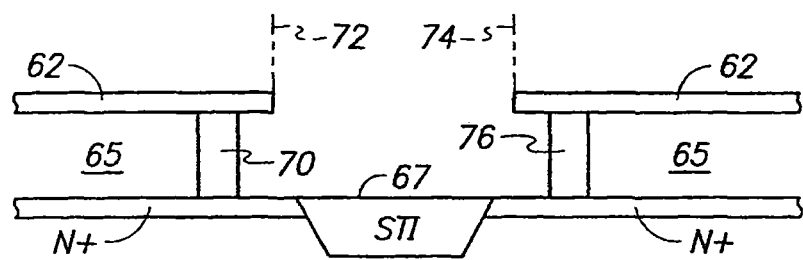
FIG. 7 is a simplified side view, in section, taken along section lines 7-7 of FIG. 6, illustrating part of an interconnection arrangement in accordance with an embodiment of the present invention.
Figure 8:
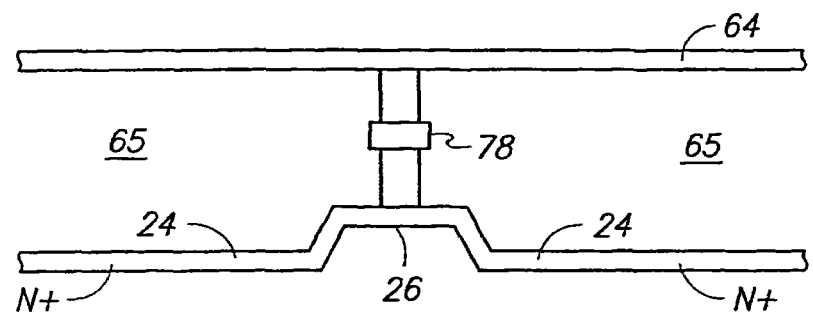
FIG. 8 is a simplified side view, in section, taken along section lines 8-8 of FIG. 6, illustrating part of an interconnection arrangement in accordance with an embodiment of the present invention.

FIG. 6 is a simplified plan view illustrating an interconnection arrangement 60 for the memory cell array 50 of FIG. 4, in accordance with an embodiment of the present invention. The interconnection arrangement 60 includes multiple patterned conductive layers 62 and 64, separated by conventional inter-level dielectric material 65 (FIGS. 7 and 8). The views in FIG. 6-8 have been simplified to show correspondence with the other Figures and to avoid undue complexity. Shallow trench isolation regions 67 isolate selected portions from one another.

FIG. 7 is a simplified side view, in section, taken along section lines 7-7 of FIG. 6, illustrating part of an interconnection arrangement in accordance with an embodiment of the present invention. FIG. 8 is a simplified side view, in section, taken along section lines 8-8 of FIG. 6, illustrating part of an interconnection arrangement in accordance with an embodiment of the present invention.

With reference to FIGS. 6-8, the patterned conductive layer 62 extends upward to nodes 70, 70', 70" and establishes electrical communication between the conductive layers 62 and selected portions of the doped region 24. The patterned conductive layer 62 stops at the line denoted 72, 72'.

Similarly, other portions of the patterned conductive layer 62 extend from the line denoted 74, 74' and extend upward, providing electrical communication from nodes 76, 76', 76" to other circuit elements. The nodes 76, 76', 76" provide contact to selected portions of the doped region 24. In contrast, patterned conductive layers 64 extend from top to bottom of FIG. 6 and electrically couple to nodes 78, 78" and thus to doped region 26. Such is but on example of a simplified interconnection arrangement suitable for use with the memory devices of FIGS. 1-5. Other arrangements are possible.

Figure 9A:
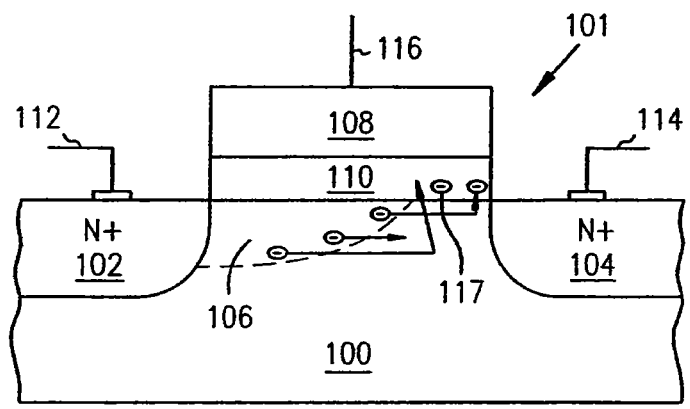
FIG. 9A is a block diagram of a metal oxide semiconductor field effect transistor (MOSFET) in a substrate according to the teachings of the prior art.

FIG. 9A is useful in illustrating the conventional operation of a MOSFET such as can be used in a DRAM array. FIG. 9A illustrates the normal hot electron injection and degradation of devices operated in the forward direction. As is explained below, since the electrons are trapped near the drain they are not very effective in changing the device characteristics.

FIG. 9A is a block diagram of a metal oxide semiconductor field effect transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bitline 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 9B:
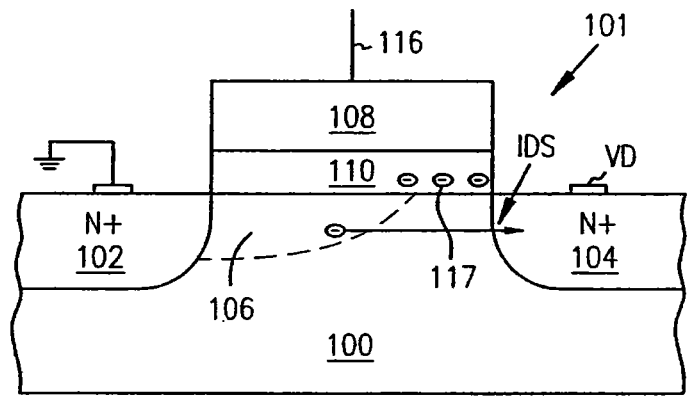
FIG. 9B illustrates the MOSFET of FIG. 9A operated in the forward direction showing some degree of device degradation due to electrons being trapped in the gate oxide near the drain region over gradual use.

In operation of the conventional MOSFET of FIG. 9A, some degree of device degradation does gradually occur for MOSFETs operated in the forward direction by electrons 117 becoming trapped in the gate oxide 110 near the drain region 104. This effect is illustrated in FIG. 9B. However, since the electrons 117 are trapped near the drain region 104 they are not very effective in changing the MOSFET characteristics.

Figure 9C:
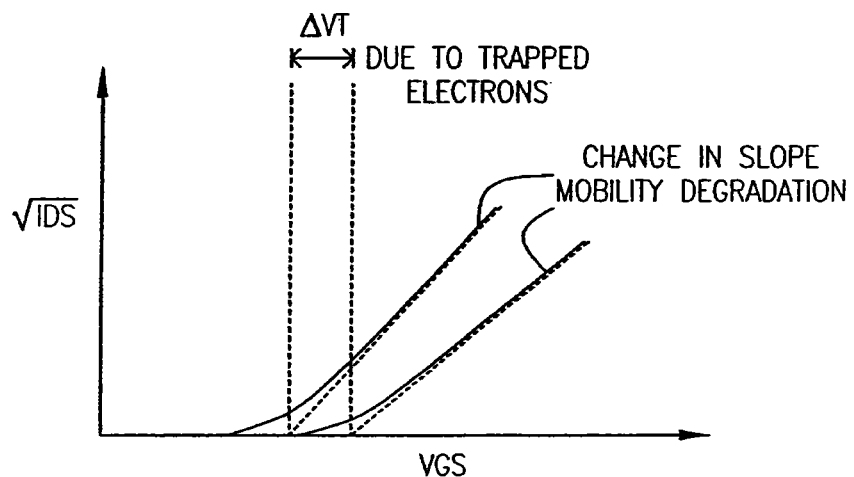
FIG. 9C is a graph showing the square root of the current signal (Ids) taken at the drain region of the conventional MOSFET versus the voltage potential (VGS) established between the gate and the source region.

FIG. 9C illustrates this point. FIG. 9C is a graph showing the square root of the current signal (Ids) taken at the drain region versus the voltage potential (VGS) established between the gate 108 and the source region 102. The change in the slope of the plot of $\sqrt{Ids}$ versus VGS represents the change in the charge carrier mobility in the channel 106.

In FIG. 9C, $\Delta VT$ represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 1 represents the charge carrier mobility in the channel 106 for FIG. 9A having no electrons trapped in the gate oxide 110. Slope 2 represents the charge mobility in the channel 106 for the conventional MOSFET of FIG. 9B having electrons 117 trapped in the gate oxide 110 near the drain region 104. As shown by a comparison of slope 1 and slope 2 in FIG. 9C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

Applicant has previously described programmable memory devices and functions based on the reverse stressing of MOSFET's in a conventional CMOS process and technology in order to form programmable address decode and correction. (See generally, L. Forbes, W. P. Noble and E. H. Cloud, "MOSFET technology for programmable address decode and correction," U.S. patent application Ser. No. 09/383,804). That disclosure, however, did not describe multistate memory cell solutions, but rather address decode and correction issues.

According to the teachings of the present invention, normal MOSFETs can be programmed by operation in the reverse direction and utilizing avalanche hot electron injection to trap electrons in the gate oxide of the MOSFET. When the programmed MOSFET is subsequently operated in the forward direction the electrons trapped in the oxide are near the source and cause the channel to have two different threshold voltage regions. The novel programmed MOSFETs of the present invention conduct significantly less current than conventional MOSFETs, particularly at low drain voltages. These electrons will remain trapped in the gate oxide unless negative gate voltages are applied. The electrons will not be removed from the gate oxide when positive or zero gate voltages are applied. Erasure can be accomplished by applying negative gate voltages and/or increasing the temperature with negative gate bias applied to cause the trapped electrons to be re-emitted back into the silicon channel of the MOSFET. (See generally, L. Forbes, E. Sun, R. Alders and J. Moll, "Field induced re-emission of electrons trapped in $SiO_2$," IEEE Trans. Electron Device, vol. ED-26, no. 11, pp. 1816-1818 (November 1979); S. S. B. Or, N. Hwang, and L. Forbes, "Tunneling and Thermal emission from a distribution of deep traps in $SiO_2$," IEEE Trans. on Electron Devices, vol. 40, no. 6, pp. 1100-1103 (June 1993); S. A. Abbas and R. C. Dockerty, "N-channel IGFET design limitations due to hot electron trapping," IEEE Int. Electron Devices Mtg., Washington D.C., December 1975, pp. 35-38).

Figure 10A:
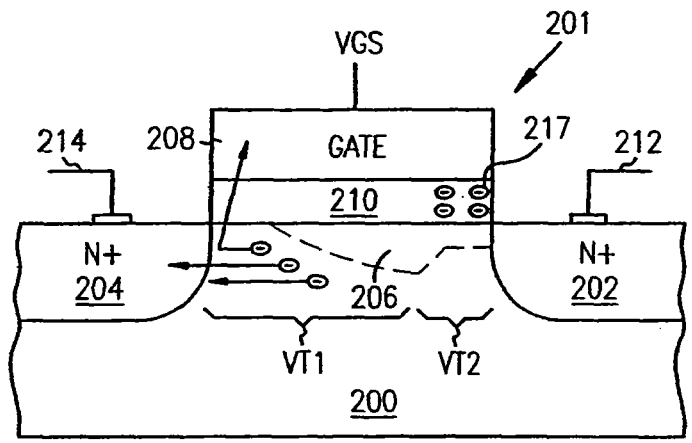
FIG. 10A is a diagram of a programmed MOSFET which can be used as a multistate cell in accordance with an embodiment of the present invention.
Figure 10B:
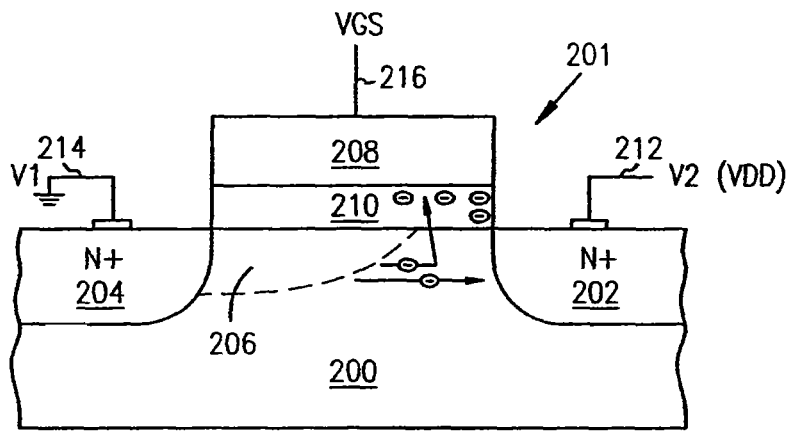
FIG. 10B is a diagram suitable for explaining the method by which the MOSFET of the multistate cell of the present invention can be programmed to achieve the embodiments of the present invention.
Figure 10C:
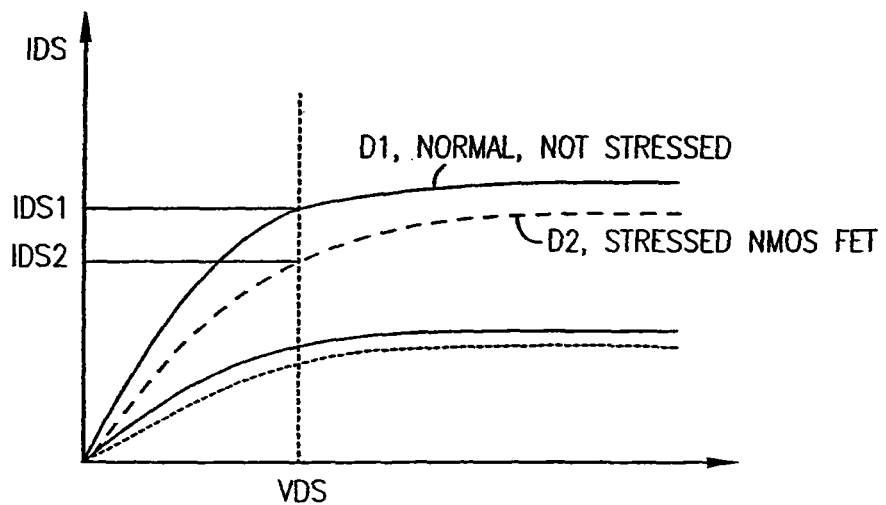
FIG. 10C is a graph plotting the current signal (Ids) detected at the drain region versus a voltage potential, or drain voltage, (VDS) set up between the drain region and the source region (Ids vs. VDS) in accordance with an embodiment of the present invention.

FIGS. 10A-10C are useful in illustrating the present invention in which a much larger change in device characteristics is obtained by programming the device in the reverse direction and subsequently reading the device by operating it in the forward direction.

FIG. 10A is a diagram of a programmed MOSFET which can be used as a multistate cell according to the teachings of the present invention. As shown in FIG. 10A the multistate cell 201 includes a MOSFET in a substrate 200 which has a first source/drain region 202, a second source/drain region 204, and a channel region 206 between the first and second source/drain regions, 202 and 204. In one embodiment, the first source/drain region 202 includes a source region 202 for the MOSFET and the second source/drain region 204 includes a drain region 204 for the MOSFET. FIG. 10A further illustrates a gate 208 separated from the channel region 206 by a gate oxide 210. A first transmission line 212 is coupled to the first source/drain region 202 and a second transmission line 214 is coupled to the second source/drain region 204. In one embodiment, the first transmission line includes a sourceline 212 and the second transmission line includes a bit line 214.

As stated above, multistate cell 201 is comprised of a programmed MOSFET. This programmed MOSFET has a charge 217 trapped in the gate oxide 210 adjacent to the first source/drain region 202 such that the channel region 206 has a first voltage threshold region (Vt1) and a second voltage threshold region (Vt2) in the channel 206. In one embodiment, the charge 217 trapped in the gate oxide 210 adjacent to the first source/drain region 202 includes a trapped electron charge 217. According to the teachings of the present invention and as described in more detail below, the multistate cell can be programmed to have one of a number of charge levels trapped in the gate insulator adjacent to the first source/drain region 202 such that the channel region 206 will have a first voltage threshold region (Vt1) and a second voltage threshold region (Vt2) and such that the programmed multistate cell operates at reduced drain source current.

FIG. 10A illustrates the Vt2 in the channel 206 is adjacent the first source/drain region 202 and that the Vt1 in the channel 206 is adjacent the second source/drain region 204. According to the teachings of the present invention, Vt2 has a higher voltage threshold than Vt1 due to the charge 217 trapped in the gate oxide 217 adjacent to the first source/drain region 202. Multiple bits can be stored on the multistate cell 201.

FIG. 10B is a diagram suitable for explaining the method by which the MOSFET of the multistate cell 201 of the present invention can be programmed to achieve the embodiments of the present invention. As shown in FIG. 10B the method includes programming the MOSFET in a reverse direction. Programming the MOSFET in the reverse direction includes applying a first voltage potential V1 to a drain region 204 of the MOSFET. In one embodiment, applying a first voltage potential V1 to the drain region 204 of the MOSFET includes grounding the drain region 204 of the MOSFET as shown in FIG. 10B. A second voltage potential V2 is applied to a source region 202 of the MOSFET. In one embodiment, applying a second voltage potential V2 to the source region 202 includes applying a high positive voltage potential (VDD) to the source region 202 of the MOSFET, as shown in FIG. 10B. A gate potential VGS is applied to a gate 208 of the MOSFET. In one embodiment, the gate potential VGS includes a voltage potential which is less than the second voltage potential V2, but which is sufficient to establish conduction in the channel 206 of the MOSFET between the drain region 204 and the source region 202. As shown in FIG. 10B, applying the first, second and gate potentials (V1, V2, and VGS respectively) to the MOSFET creates a hot electron injection into a gate oxide 210 of the MOSFET adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the gate oxide 210 adjacent to the source region 202. Here the charge carriers become trapped.

In one embodiment of the present invention, the method is continued by subsequently operating the MOSFET in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the gate insulator. That is, a gate potential can be applied to the gate 208 by a wordline 216 in an effort to form a conduction channel between the source and the drain regions as done with addressing and reading conventional DRAM cells.

However, now in its programmed state, the conduction channel 206 of the MOSFET will have a first voltage threshold region (Vt1) adjacent to the drain region 204 and a second voltage threshold region (Vt2) adjacent to the source region 202, as explained and described in detail in connection with FIG. 10A. According to the teachings of the present invention, the Vt2 has a greater voltage threshold than the Vt1 due to the hot electron injection 217 into a gate oxide 210 of the MOSFET adjacent to the source region 202.

FIG. 10C is a graph plotting a current signal (Ids) detected at the second source/drain region 204 versus a voltage potential, or drain voltage, (VDS) set up between the second source/drain region 204 and the first source/drain region 202 (Ids vs. VDS). In one embodiment, VDS represents the voltage potential set up between the drain region 204 and the source region 202. In FIG. 10C, the curve plotted as D1 represents the conduction behavior of a conventional MOSFET which is not programmed according to the teachings of the present invention. The curve D2 represents the conduction behavior of the programmed MOSFET, described above in connection with FIG. 10A, according to the teachings of the present invention. As shown in FIG. 10C, for a particular drain voltage, VDS, the current signal (IDS2) detected at the second source/drain region 204 for the programmed MOSFET (curve D2) is significantly lower than the current signal (IDS1) detected at the second source/drain region 204 for the conventional MOSFET which is not programmed according to the teachings of the present invention. Again, this is attributed to the fact that the channel 206 in the programmed MOSFET of the present invention has two voltage threshold regions and that the voltage threshold, Vt2, near the first source/drain region 202 has a higher voltage threshold than Vt1 near the second source/drain region due to the charge 217 trapped in the gate oxide 217 adjacent to the first source/drain region 202.

Some of these effects have recently been described for use in a different device structure, called an NROM, for flash memories. This latter work in Israel and Germany is based on employing charge trapping in a silicon nitride layer in a non-conventional flash memory device structure. (See generally, B. Eitan et al., "Characterization of Channel Hot Electron Injection by the Subthreshold Slope of NROM device," IEEE Electron Device Lett., Vol. 22, No. 11, pp. 556-558, (November 2001); B. Etian et al., "NROM: A novel localized Trapping, 2-Bit Nonvolatile Memory Cell," IEEE Electron Device Lett., Vol. 21, No. 11, pp. 543-545, (November 2000)). Charge trapping in silicon nitride gate insulators was the basic mechanism used in MNOS memory devices (see generally, S. Sze, Physics of Semiconductor Devices, Wiley, N.Y., 1981, pp. 504-506), charge trapping in aluminum oxide gates was the mechanism used in MIOS memory devices (see generally, S. Sze, Physics of Semiconductor Devices, Wiley, N.Y., 1981, pp. 504-506), and Applicant has previously disclosed charge trapping at isolated point defects in gate insulators (see generally, L. Forbes and J. Geusic, "Memory using insulator traps," U.S. Pat. No. 6,140,181, issued Oct. 31, 2000).

In contrast to the above work, the present invention discloses programming a MOSFET in a reverse direction to trap one of a number of charge levels near the source region and reading the device in a forward direction to form a multistate memory cell based on a modification of DRAM technology.

Prior art DRAM technology generally employs silicon oxide as the gate insulator. Further the emphasis in conventional DRAM devices is placed on trying to minimize charge trapping in the silicon oxide gate insulator. According to the teachings of the present invention, a variety of insulators are used to trap electrons more efficiently than in silicon oxide. That is, in the present invention, the multistate memory cell employs charge trapping in gate insulators such as, wet silicon oxide, silicon nitride, silicon oxynitride SON, silicon rich oxide SRO, aluminum oxide $Al_2O_3$, composite layers of these insulators such as oxide and then silicon nitride, or oxide and then aluminum oxide, or multiple layers as oxide-nitride-oxide. While the charge trapping efficiency of silicon oxide may be low such is not the case for silicon nitride or composite layers of silicon oxide and nitride.

Figure 11:
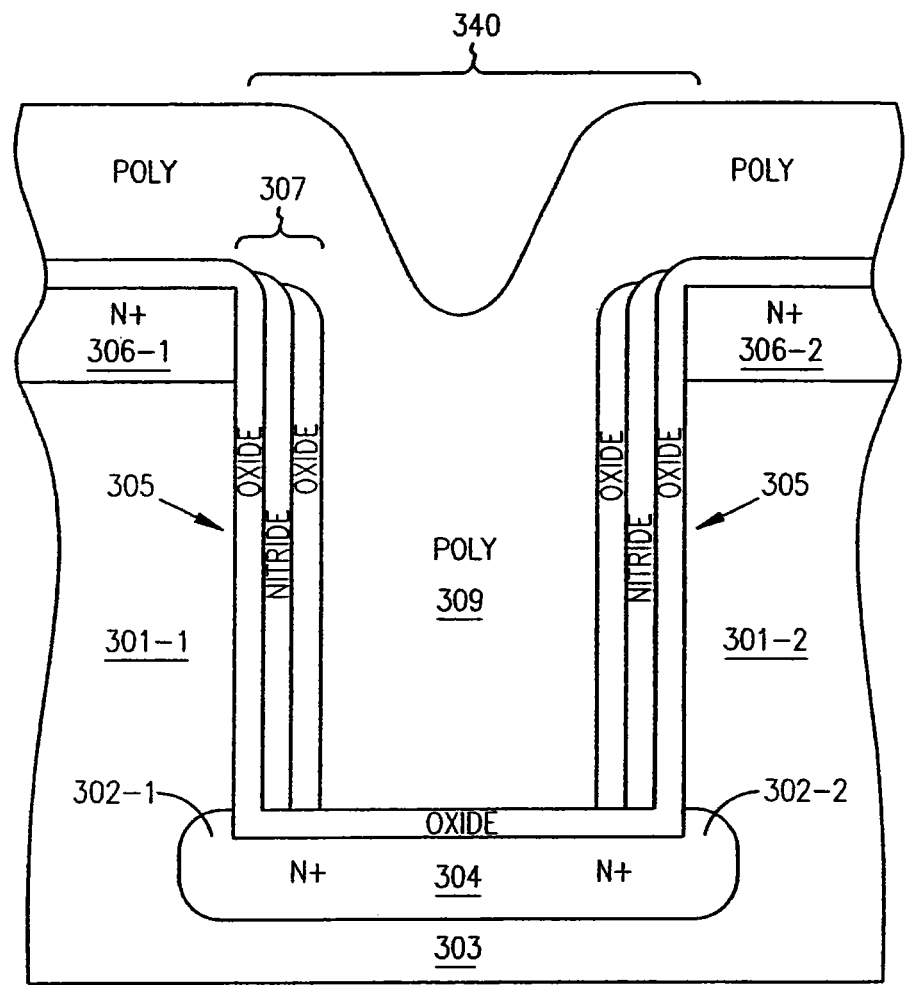
FIG. 11 illustrates a portion of a memory array in accordance with an embodiment of the present invention.

FIG. 11 illustrates a portion of a memory array 300 according to the teachings of the present invention. The memory in FIG. 11 is shown illustrating a number of vertical pillars, or multistate cells, 301-1 and 301-2 formed according to the teachings of the present invention. As one of ordinary skill in the art will appreciate upon reading this disclosure, the number of vertical pillars are formed in rows and columns extending outwardly from a substrate 303. As shown in FIG. 11, the number of vertical pillars, 301-1 and 301-2 are separated by a number of trenches 340. According to the teachings of the present invention, the number of vertical pillars, 301-1 and 301-2, serve as transistors including a first source/drain region, 302-1 and 302-2, respectively. The first source/drain region, 302-1 and 302-2, is coupled to a sourceline 304. As shown in FIG. 11, the sourceline 304 is formed in a bottom of the trenches 340 between rows of the vertical pillars, 301-1 and 301-2. In one embodiment, according to the teachings of the present invention, the sourceline 304 is formed from a doped region implanted in the bottom of the trench. A second source/drain region, 306-1 and 306-2 respectively, is coupled to a bitline (not shown). A channel region 305 is located between the first and the second source/drain regions.

As shown in FIG. 11, a gate 309 is separated from the channel region 305 by a gate insulator 307 in the trenches 340 along rows of the vertical pillars, 301-1 and 301-2. In one embodiment, according to the teachings of the present invention, the gate insulator 307 includes a gate insulator 307 selected from the group of silicon dioxide ($SiO_2$) formed by wet oxidation, silicon oxynitride (SON), silicon rich oxide (SRO), and aluminum oxide ($Al_2O_3$). In another embodiment, according to the teachings of the present invention, the gate insulator 307 includes a gate insulator 307 selected from the group of silicon rich aluminum oxide insulators, silicon rich oxides with inclusions of nanoparticles of silicon, silicon oxide insulators with inclusions of nanoparticles of silicon carbide, and silicon oxycarbide insulators. In another embodiment, according to the teachings of the present invention, the gate insulator 307 includes a composite layer 307. In this embodiment, the composite layer 307 includes a composite layer 307 selected from the group of an oxide-aluminum oxide ($Al_2O_3$)-oxide composite layer, and oxide-silicon oxycarbide-oxide composite layer. In another embodiment, the composite layer 307 includes a composite layer 307, or a non-stoichiometric single layer, of two or more materials selected from the group of silicon (Si), titanium (Ti), and tantalum (Ta). In another embodiment, according to the teachings of the present invention, the gate insulator 307 includes an oxide-nitride-oxide (ONO) gate insulator 307.

Figure 12:
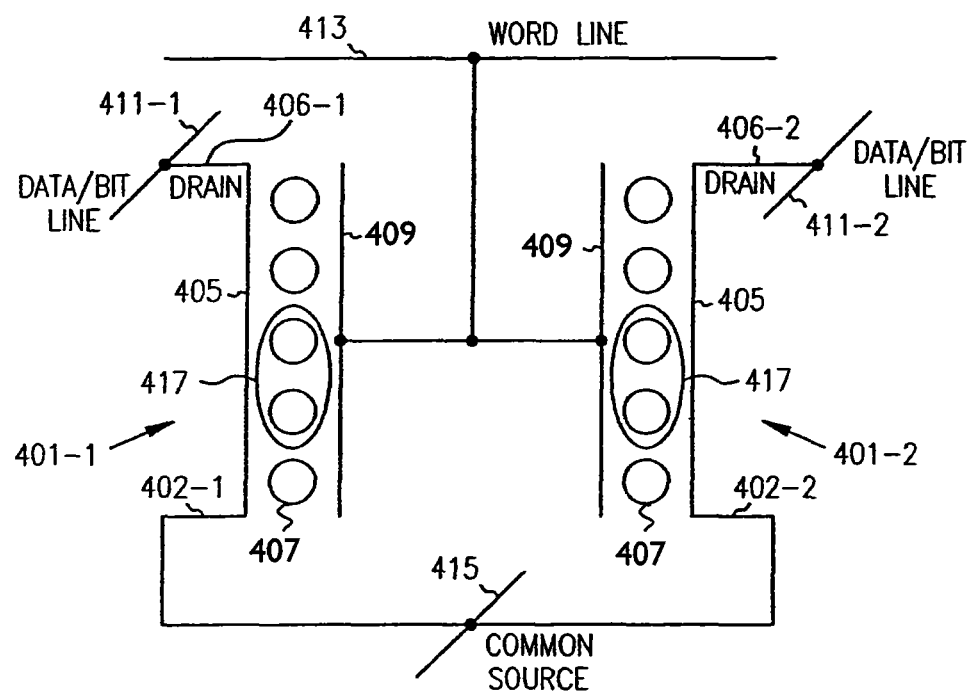
FIG. 12 illustrates an electrical equivalent circuit for the portion of the memory array shown in FIG. 11.

FIG. 12 illustrates an electrical equivalent circuit 400 for the portion of the memory array shown in FIG. 11. As shown in FIG. 12, a number of vertical multistate cells, 401-1 and 401-2, are provided. Each vertical multistate cell, 401-1 and 401-2, includes a first source/drain region, 402-1 and 402-2, a second source/drain region 406-1 and 406-2, a channel region 405 between the first and the second source/drain regions, and a gate 409 separated from the channel region by a gate insulator 407.

FIG. 12 further illustrates a number of bit lines, 411-1 and 411-2, coupled to the second source/drain region 406-1 and 406-2 of each multistate cell. In one embodiment, as shown in FIG. 12, the number of bit lines, 411-1 and 411-2, are coupled to the second source/drain region 406-1 and 406-2 along rows of the memory array. A number of word lines, such as wordline 413 in FIG. 12, are coupled to the gate 409 of each multistate cell along columns of the memory array. And, a number of sourcelines, such as common sourceline 415, are coupled to the first source/drain regions, e.g. 402-1 and 402-2, along columns of the vertical multistate cells, 401-1 and 401-2, such that adjacent pillars containing these transistors share the common sourceline 415. In one embodiment, column adjacent pillars include a transistor which operates as a vertical multistate cell, e.g. 401-1, on one side of a shared trench, the shared trench separating rows of the pillars as described in connection with FIG. 11, and a transistor which operates as a reference cell, e.g. 401-2, having a programmed conductivity state on the opposite side of the shared trench. In this manner, according to the teachings of the present invention and as described in more detail below, at least one of multistate cells can be programmed to have one of a number of charge levels trapped in the gate insulator, shown generally as 417, adjacent to the first source/drain region, e.g. 402-1, such that the channel region 405 will have a first voltage threshold region (Vt1) and a second voltage threshold region (Vt2) and such that the programmed multistate cell operates at reduced drain source current.

Figure 13:
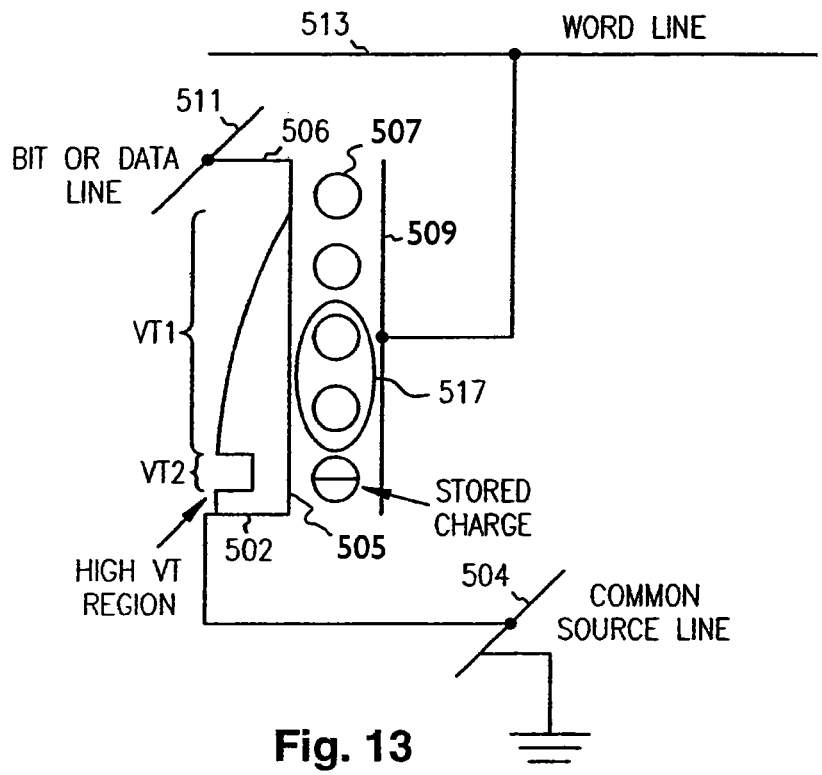
FIG. 13 is another electrical equivalent circuit useful in illustrating a read operation on the novel multistate cell in accordance with an embodiment of the present invention.

FIG. 13 is another electrical equivalent circuit useful in illustrating a read operation on the novel multistate cell 500 according to the teachings of the present invention. The electrical equivalent circuit in FIG. 13 represents a programmed vertical multistate cell. As explained in detail in connection with FIG. 11, the programmed vertical multistate cell 500 includes a vertical metal oxide semiconductor field effect transistor (MOSFET) 500 extending outwardly from a substrate. The MOSFET has a source region 502, a drain region 506, a channel region 505 between the source region 502 and the drain region 506, and a gate 509 separated from the channel region 505 by a gate insulator, shown generally as 507.

As shown in FIG. 13 a wordline 513 is coupled to the gate 509. A sourceline 504, formed in a trench adjacent to the vertical MOSFET as described in connection with FIG. 11, is coupled to the source region 502. A bit line, or data line 511 is coupled to the drain region 506. The multistate cell 500 shown in FIG. 13 is an example of a programmed multistate cell 500 having one of a number of charge levels trapped in the gate insulator, shown generally as 517, adjacent to the first source/drain region, 502, such that the channel region 505 will have a first voltage threshold region (Vt1) and a second voltage threshold region (Vt2) and such that the programmed multistate cell 500 operates at reduced drain source current. According to the teachings of the present invention, the second voltage threshold region (Vt2) is now a high voltage threshold region which is greater than the first voltage threshold region (Vt1).

Figure 14:
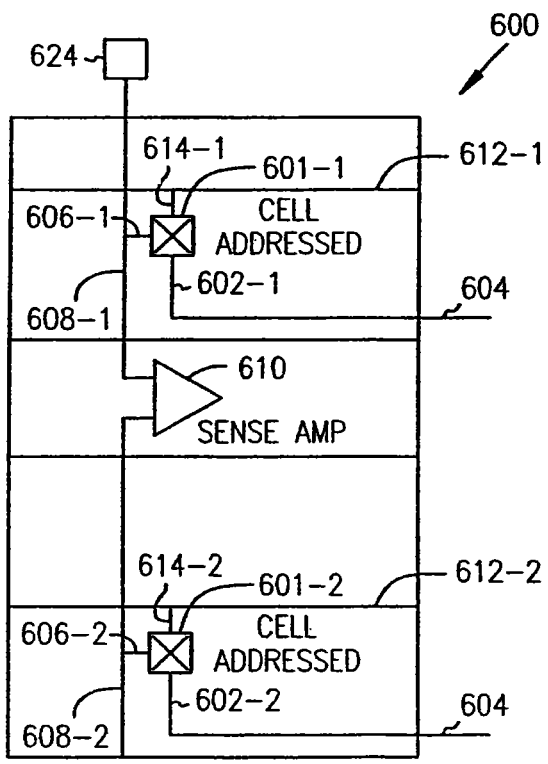
FIG. 14 illustrates a portion of a memory array in accordance with an embodiment of the present invention.

FIG. 14 illustrates a portion of a memory array 600 according to the teachings of the present invention. The memory in FIG. 14 is shown illustrating a pair of multistate cells 601-1 and 601-2 formed according to the teachings of the present invention. As one of ordinary skill in the art will understand upon reading this disclosure, any number of multistate cells can be organized in an array, but for ease of illustration only two are displayed in FIG. 14. As shown in FIG. 14, a first source/drain region, 602-1 and 602-2 respectively, is coupled to a sourceline 604. A second source/drain region, 606-1 and 606-2 respectively, is coupled to a bitline, 608-1 and 608-2 respectively. Each of the bitlines, 608-1 and 608-2, couple to a sense amplifier, shown generally at 610. A wordline, 612-1 and 612-2 respectively, is couple to a gate, 614-1 and 614-2 respectively, for each of the multistate cells, 601-1 and 601-2. According to the teachings of the present invention, the wordlines, 612-1 and 612-2, run across or are perpendicular to the rows of the memory array 600. Finally, a write data/precharge circuit is shown at 624 for coupling a first or a second potential to bitline 608-1. As one of ordinary skill in the art will understand upon reading this disclosure, the write data/precharge circuit 624 is adapted to couple either a ground to the bitline 608-1 during a write operation in the reverse direction, or alternatively to precharge the bitline 608-1 to fractional voltage of VDD during a read operation in the forward direction. As one of ordinary skill in the art will understand upon reading this disclosure, the sourceline 604 can be biased to a voltage higher than VDD during a write operation in the reverse direction, or alternatively grounded during a read operation in the forward direction.

As shown in FIG. 14, the array structure 600, including multistate cells 601-1 and 601-2, has no capacitors. Instead, according to the teachings of the present invention, the first source/drain region or source region, 602-1 and 602-2, are coupled directly to the sourceline 604. In order to write, the sourceline 604 is biased to voltage higher than VDD and the devices stressed in the reverse direction by grounding the data or bit line, 608-1 or 608-2. If the multistate cell, 601-1 or 601-2, is selected by a word line address, 612-1 or 612-2, then the multistate cell, 601-1 or 601-2, will conduct and be stressed with accompanying hot electron injection into the cells gate insulator adjacent to the source region, 602-1 or 602-2. As one of ordinary skill in the art will understand upon reading this disclosure, a number of different charge levels can be programmed into the gate insulator adjacent to source region such that the cells is used as a differential cell and/or the cell is compared to a reference or dummy cell, as shown in FIG. 14, and multiple bits can be stored on the multistate cell.

During read the multistate cell, 601-1 or 601-2, is operated in the forward direction with the sourceline 604 grounded and the bit line, 608-1 or 608-2, and respective second source/drain region or drain region, 606-1 and 606-2, of the cells precharged to some fractional voltage of Vdd. If the device is addressed by the word line, 612-1 or 612-2, then its conductivity will be determined by the presence or absence of the amount of stored charge trapped in the gate insulator as measured or compared to the reference or dummy cell and so detected using the sense amplifier 610. The operation of DRAM sense amplifiers is described, for example, in U.S. Pat. Nos. 5,627,785; 5,280,205; and 5,042,011, all assigned to Micron Technology Inc., and incorporated by reference herein. The array would thus be addressed and read in the conventional manner used in DRAM's, but programmed as multistate cells in a novel fashion.

In operation the devices would be subjected to hot electron stress in the reverse direction by biasing the sourceline 604, and read while grounding the sourceline 604 to compare a stressed multistate cell, e.g. cell 601-1, to an unstressed dummy device/cell, e.g. 601-2, as shown in FIG. 14. The write and possible erase feature could be used during manufacture and test to initially program all cells or devices to have similar or matching conductivity before use in the field. Likewise, the transistors in the reference or dummy cells, e.g. 601-2, can all initially be programmed to have the same conductivity states. According to the teachings of the present invention, the sense amplifier 610 can then detect small differences in cell or device characteristics due to stress induced changes in device characteristics during the write operation.

As one of ordinary skill in the art will understand upon reading this disclosure such arrays of multistate cells are conveniently realized by a modification of DRAM technology. According to the teachings of the present invention a gate insulator of the multistate cell includes gate insulators selected from the group of thicker layers of $SiO_2$ formed by wet oxidation, SON silicon oxynitride, SRO silicon rich oxide, $Al_2O_3$ aluminum oxide, composite layers and implanted oxides with traps (L. Forbes and J. Geusic, "Memory using insulator traps," U.S. Pat. No. 6,140,181, issued Oct. 31, 2000). Conventional transistors for address decode and sense amplifiers can be fabricated after this step with normal thin gate insulators of silicon oxide.

Figure 15A:
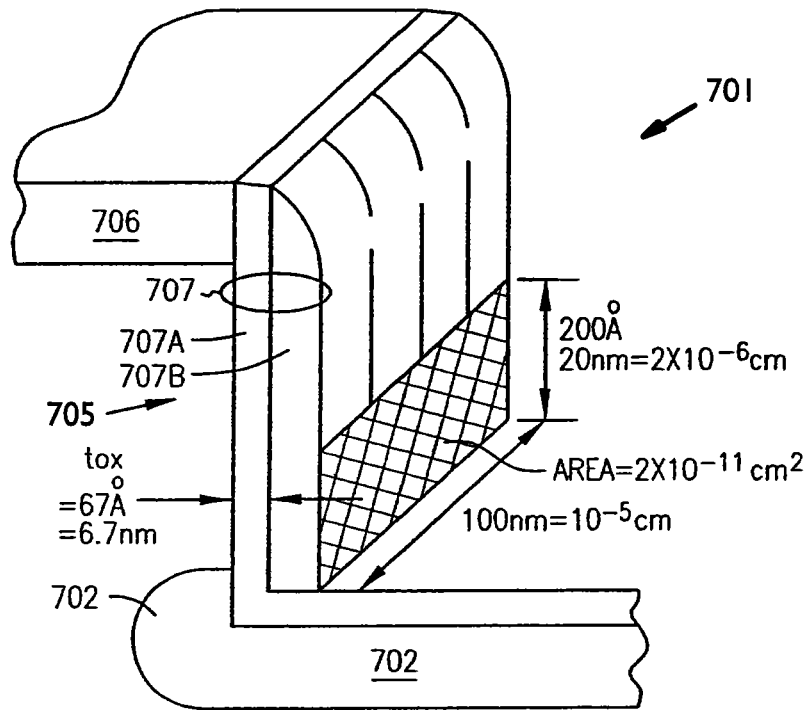
FIG. 15A, illustrates one embodiment of the gate insulator for the present invention having a number of layers, e.g., an ONO stack, where the layer closest to the channel includes an oxide layer, and a nitride layer is formed thereon.

FIGS. 15A-15B and 16A-16B are useful in illustrating the use of charge storage in the gate insulator to modulate the conductivity of the multistate cell according to the teachings of the present invention. That is, FIGS. 15A-16B illustrate the operation of the novel multistate cell 701 formed according to the teachings of the present invention. As shown in FIG. 15A, the gate insulator 707 has a number of layers, e.g. an ONO stack, where layer 707A is the oxide layer closest to the channel 705 and a nitride layer 707B is formed thereon. In the embodiment shown in FIG. 15A the oxide layer 707A is illustrated having a thickness of approximately 6.7 nm or 67 Å (roughly $10^{-6}$ cm). In the embodiment shown in FIG. 15A a multistate cell is illustrated having dimensions of 0.1 μm ($10^{-5}$ cm) by 0.1 μm. For purposes of illustration, the charge storage region near the source can reasonably have dimensions of 0.1 micron (1000 Å) by 0.02 micron (200 Å) in a 0.1 micron technology. If the gate oxide 707A nearest the channel 705 is 67 Å then a charge of 100 electrons will cause a threshold voltage shift in this region of 1.6 Volts since the oxide capacitance is about 0.5 micro-Farad (μF) per square centimeter. If the transistor has a total effective oxide thickness of 200 Å then a change in the threshold voltage of only 0.16 Volts near the source, corresponding to 10 electrons, is estimated to change the transistor current by 4 micro Amperes (μA). The sense amplifier described in connection with FIG. 14, which is similar to a DRAM sense amplifier, can easily sense this charge difference on the data or bitlines. In this embodiment, the sensed charge difference on the data or bitlines will be 40 femto Coulombs (fC) over a sense period of 10 nano seconds (nS).

To illustrate these numbers, the capacitance, Ci, of the structure depends on the dielectric constant, $\in i$, (which for silicon dioxide $SiO_2$ equates to $1.06/3 \times 10^{-12}$ F/cm), and the thickness of the insulating layers, t, (given here as $6.7 \times 10^{-7}$ cm), such that $Ci=\in i/t=((1.06 \times 10^{-12}$ F/cm$/(3 \times 6.7 \times 10^{-7}$ cm$))=0.5 \times 10^{-6}$ Farads/cm$^2$ (F/cm$^2$). This value taken over the charge storage region near the source, e.g. 20 nm×100 nm or $2 \times 10^{-11}$ cm$^2$, results in a capacitance value of $Ci=10^{-17}$ Farads. Thus, for a change in the threshold voltage of ΔV=1.6 Volts the stored charge must be $Q=C \times \Delta V=(10^{-17}$ Farads×1.6 Volts$)=1.6 \times 10^{-17}$ Coulombs. Since Q=Nq, the number of electrons stored is approximately $Q/q=(1.6 \times 10^{-17}$ Coulombs/$1.6 \times 10^{-19}$ Coulombs) or 100 electrons. In effect, the programmed multistate cell, or modified MOSFET is a programmed MOSFET having a charge trapped in the gate insulator adjacent to a first source/drain region, or source region, such that the channel region has a first voltage threshold region (Vt1) and a second voltage threshold region (Vt2), where Vt2 is greater than Vt1, and Vt2 is adjacent the source region such that the programmed MOSFET operates at reduced drain source current. For ΔQ=100 electrons in the dimensions given above, if the transistor has a total effective oxide thickness of 200 Å then a change in the threshold voltage of only 0.16 Volts near the source, corresponding to 10 electrons, is estimated to change the transistor current by 4 micro Amperes (μA). As stated above, the sense amplifier described in connection with FIG. 14, which is similar to a DRAM sense amplifier, can easily sense this charge difference on the data or bitlines. And, the sensed charge difference on the data or bitlines will be 40 femto Coulombs (fC) over a sense period of 10 nano seconds (nS) for this representative one of a number of stored charge levels according to the teachings of the present invention. Again, a number of different charge levels can be programmed into the gate insulator adjacent to source region such that the cell is used as a differential cell and/or the cell is compared to a reference or dummy cell, as shown in FIG. 14, and multiple bits can be stored on the multistate cell of the present invention.

Figure 15B:
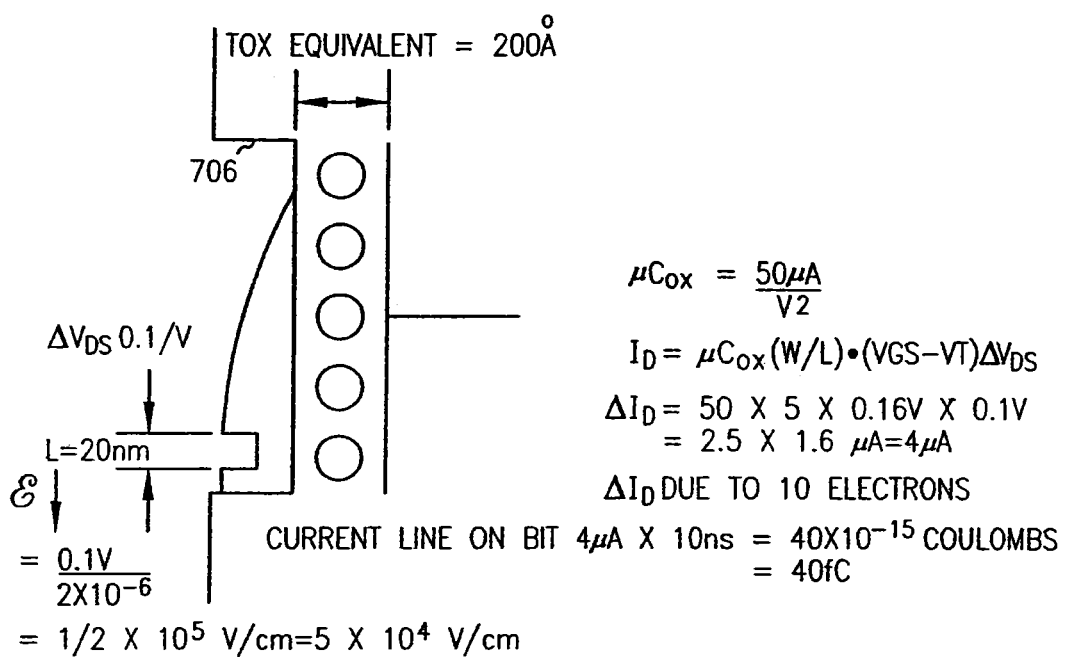
FIG. 15B aids to further illustrate the conduction behavior of the novel multistate cell of the present invention.

FIG. 15B aids to further illustrate the conduction behavior of the novel multistate cell of the present invention. The electrical equivalent circuit shown in FIG. 15B illustrates a multistate cell 701 having an equivalent oxide thickness of 200 Å. The charge storage region near the source 702 can reasonably have a length dimension of 0.02 micron (20 nm) in a 0.1 micron technology with a width dimension of 0.1 micron (100 nm). Therefore, for a change in the drain source voltage (Δ VDS) in this region an electric field of $E=(0.1 V/2 \times 10^{-6}$ cm$)=0.5 \times 10^5$ V/cm or $5 \times 10^4$ V/cm is provided. The drain current is calculated using the formula $ID=\mu Cox \times (W/L) \times (Vgs-Vt) \times \Delta$ VDS. In this example, $\mu Cox=\mu Ci$ is taken as 50 μA/V2 and W/L=5. Appropriate substitution into the drain current provides ID=(50 μA/V2×5×0.16 Volts×0.1 Volts)=2.5×1.6 μA=4 μA. As noted above this drain current ID corresponds to 10 electrons trapped in the gate insulator, or charge storage region 707 near the source 702. Sensed over a period of 10 nanoSeconds (nS) produces a current on the bitline of 40 fC (e.g. 4 µA×10 nS=40×10⁻¹⁵ Coulombs).

Figure 16A:
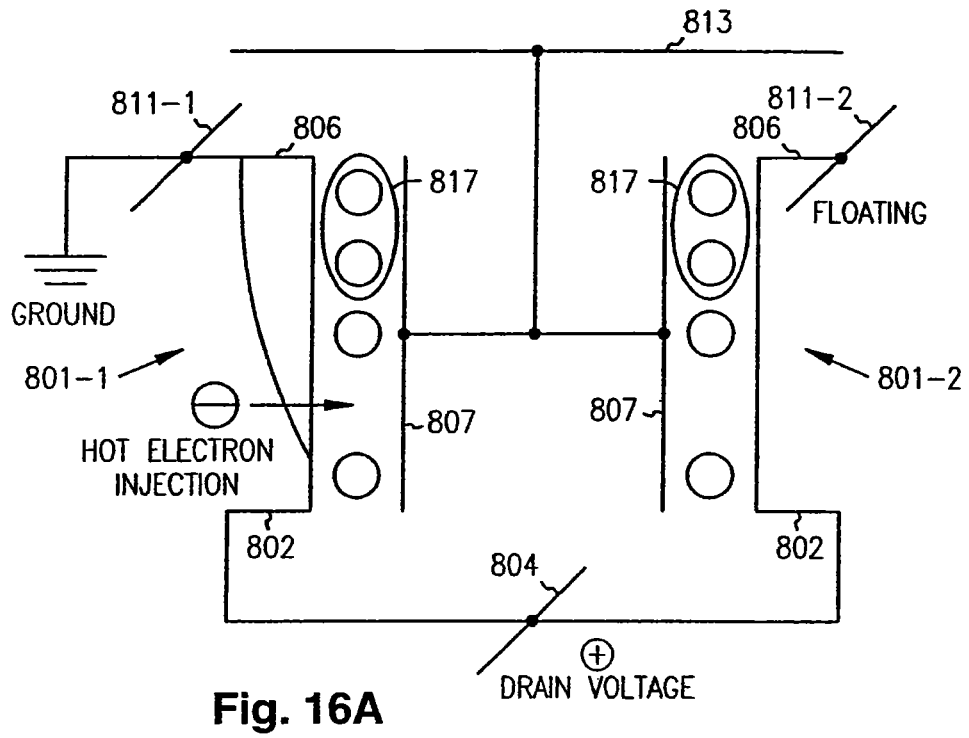
FIG. 16A illustrates the operation and programming the novel multistate cell in the reverse direction.
Figure 16B:
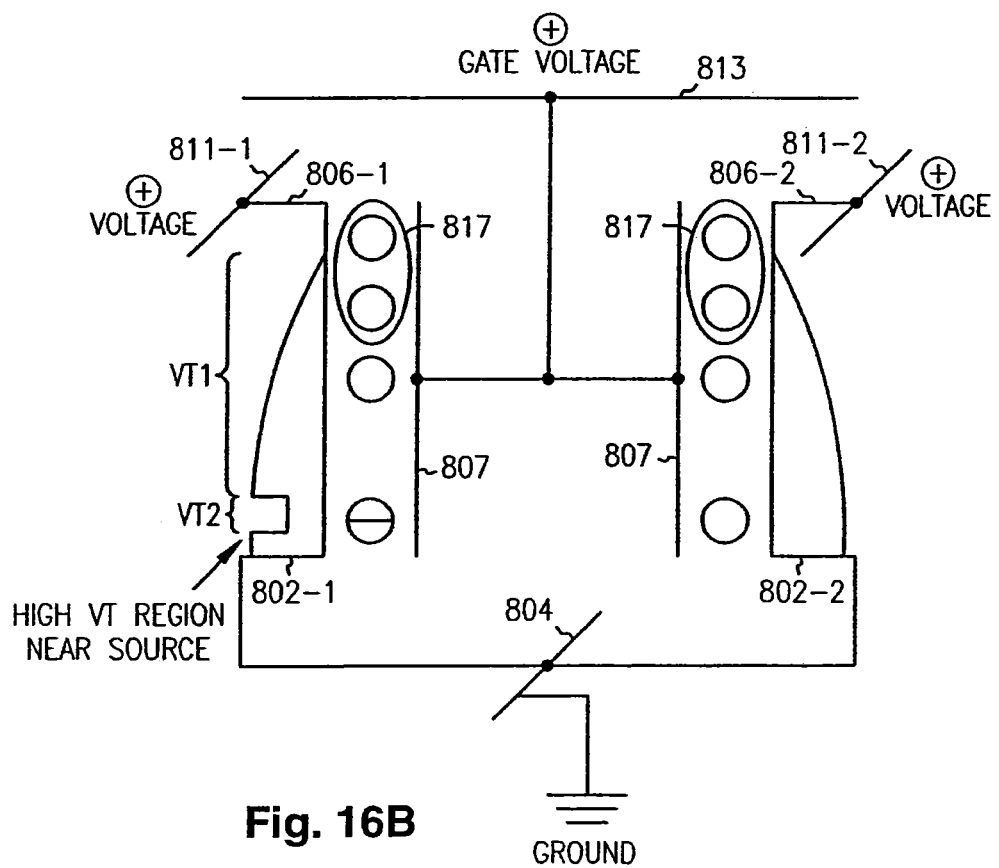
FIG. 16B illustrates the now programmed multistate cell's operation in the forward direction and differential read occurring in this differential cell embodiment, e.g., 2 transistors in each cell.

FIGS. 16A and 16B, illustrate the operation and programming the novel multistate cell as described above. However, FIGS. 16A and 16B also help illustrate an alternative array configuration where adjacent devices are compared and one of the devices on the opposite side of a shared trench is used as a dummy cell transistor or reference device. Again, the reference devices can all be programmed to have the same initial conductivity state. FIG. 16A illustrates the operation and programming the novel multistate cell in the reverse direction. As shown in FIG. 16A, a transistor 801-1 on one side of the trench (as described in connection with FIG. 11) is stressed by grounding its respective drain line, e.g. 811-1. As shown in FIG. 16A, the drain line 811-2 for the transistor 801-2 on the opposite side of the trench is left floating. A voltage is applied to the shared sourceline 804 located at the bottom of the trench (as described in connection with FIG. 11) which now acts as a drain. As shown in this electrical equivalent circuit, the neighboring (shared trench)/column adjacent transistors, 801-1 and 801-2, share a gate 807 and the wordline 813, e.g. polysilicon gate lines, coupling thereto run across or are perpendicular to the rows containing the bit and source lines, e.g. 811-1, 811-2, and 804. A gate voltage is applied to the gates 807. Here the multistate cell 801-1 will conduct and be stressed with accompanying hot electron injection into the cells gate insulator 817 adjacent to the source region 802-1.

FIG. 16B illustrates the now programmed multistate cell's operation in the forward direction and differential read occurring in a this differential cell embodiment, e.g. 2 transistors in each cell. To read this state the drain and source (or ground) have the normal connections and the conductivity of the multistate cell is determined. That is, the drain line, 811-1 and 811-2, have the normal forward direction potential applied thereto. The shared sourceline 804 located at the bottom of the trench (as described in connection with FIG. 11) is grounded and once again acts as a source. And, a gate voltage is applied to the gates 807. As one of ordinary skill in the art will understand upon reading this disclosure, a number of different charge levels can be programmed into the gate insulator 817 adjacent to source region 802-1 and compared to the reference or dummy cell, 802-2. Thus, according to the teachings of present invention multiple bits can be stored on the multistate cell.

As stated above, these novel multistate cells can be used in a DRAM like array. Two transistors can occupy an area of 4F squared (F=the minimum lithographic feature size) when viewed from above, or each memory cell consisting of one transistor utilizing an area of 2F squared. Each transistor can now, however, store many bits so the data storage density is much higher than one bit for each 1F squared unit area. Using a reference or dummy cell for each memory transistor where the reference transistor is in close proximity, e.g. the embodiment shown in FIGS. 16A and 16B vs. that shown in FIG. 12, results in better matching characteristics of transistors, but a lower memory density.

Figure 17:
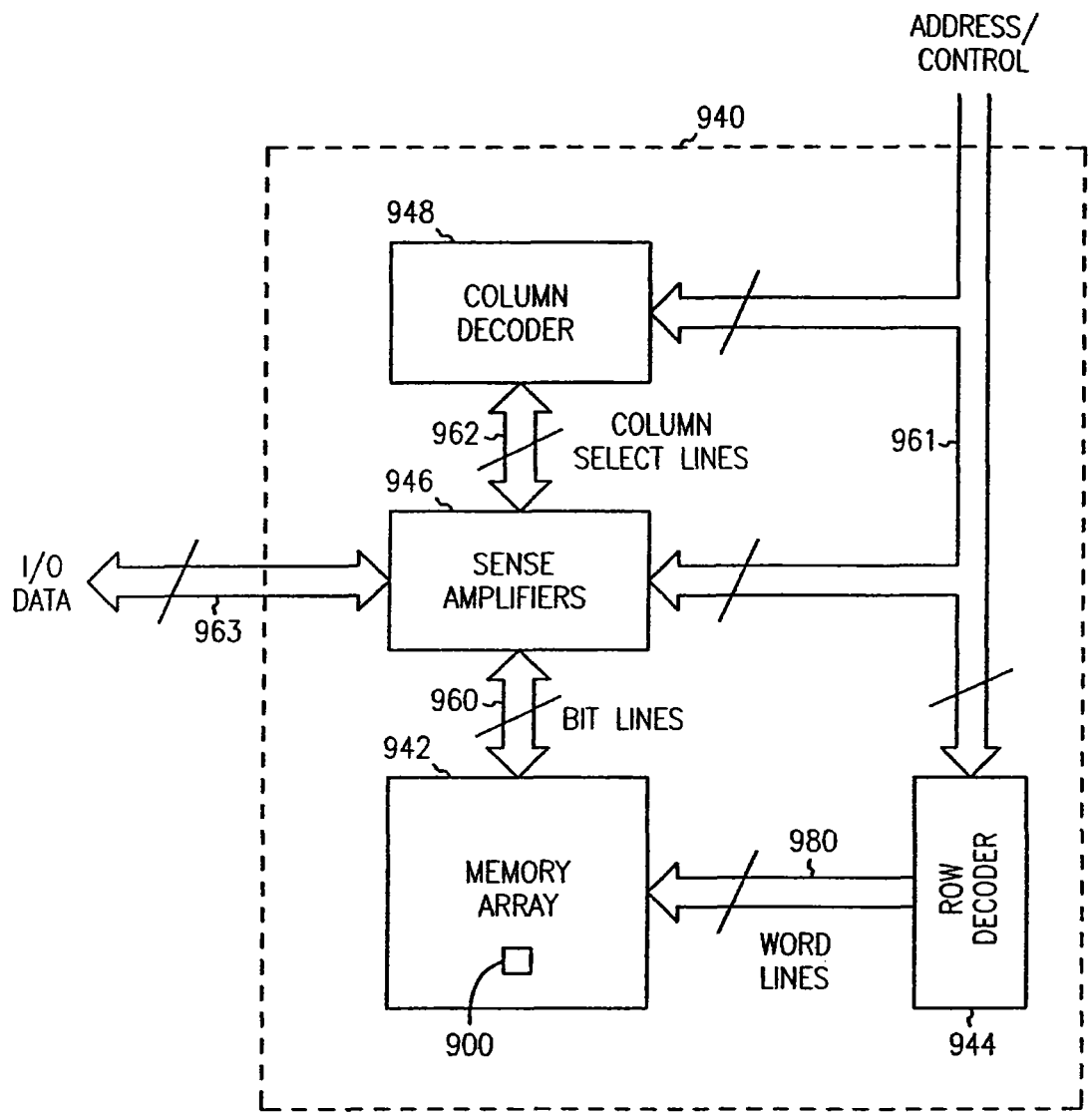
FIG. 17 illustrates a memory device in accordance with an embodiment of the present invention.

In FIG. 17 a memory device is illustrated according to the teachings of the present invention. The memory device 940 contains a memory array 942, row and column decoders 944, 948 and a sense amplifier circuit 946. The memory array 942 consists of a plurality of multistate cells 900, formed according to the teachings of the present invention whose word lines 980 and bit lines 960 are commonly arranged into rows and columns, respectively. The bit lines 960 of the memory array 942 are connected to the sense amplifier circuit 946, while its word lines 980 are connected to the row decoder 944. Address and control signals are input on address/control lines 961 into the memory device 940 and connected to the column decoder 948, sense amplifier circuit 946 and row decoder 944 and are used to gain read and write access, among other things, to the memory array 942.

The column decoder 948 is connected to the sense amplifier circuit 946 via control and column select signals on column select lines 962. The sense amplifier circuit 946 receives input data destined for the memory array 942 and outputs data read from the memory array 942 over input/output (I/O) data lines 963. Data is read from the cells of the memory array 942 by activating a word line 980 (via the row decoder 944), which couples all of the memory cells corresponding to that word line to respective bit lines 960, which define the columns of the array. One or more bit lines 960 are also activated. When a particular word line 980 and bit lines 960 are activated, the sense amplifier circuit 946 connected to a bit line column detects and amplifies the conduction sensed through a given multistate cell, where in the read operation the source region of a given cell is couple to a grounded array plate (not shown), and transferred its bit line 960 by measuring the potential difference between the activated bit line 960 and a reference line which may be an inactive bit line. The operation of Memory device sense amplifiers is described, for example, in U.S. Pat. Nos. 5,627,785; 5,280,205; and 5,042,011, all assigned to Micron Technology Inc., and incorporated by reference herein.

Figure 18:
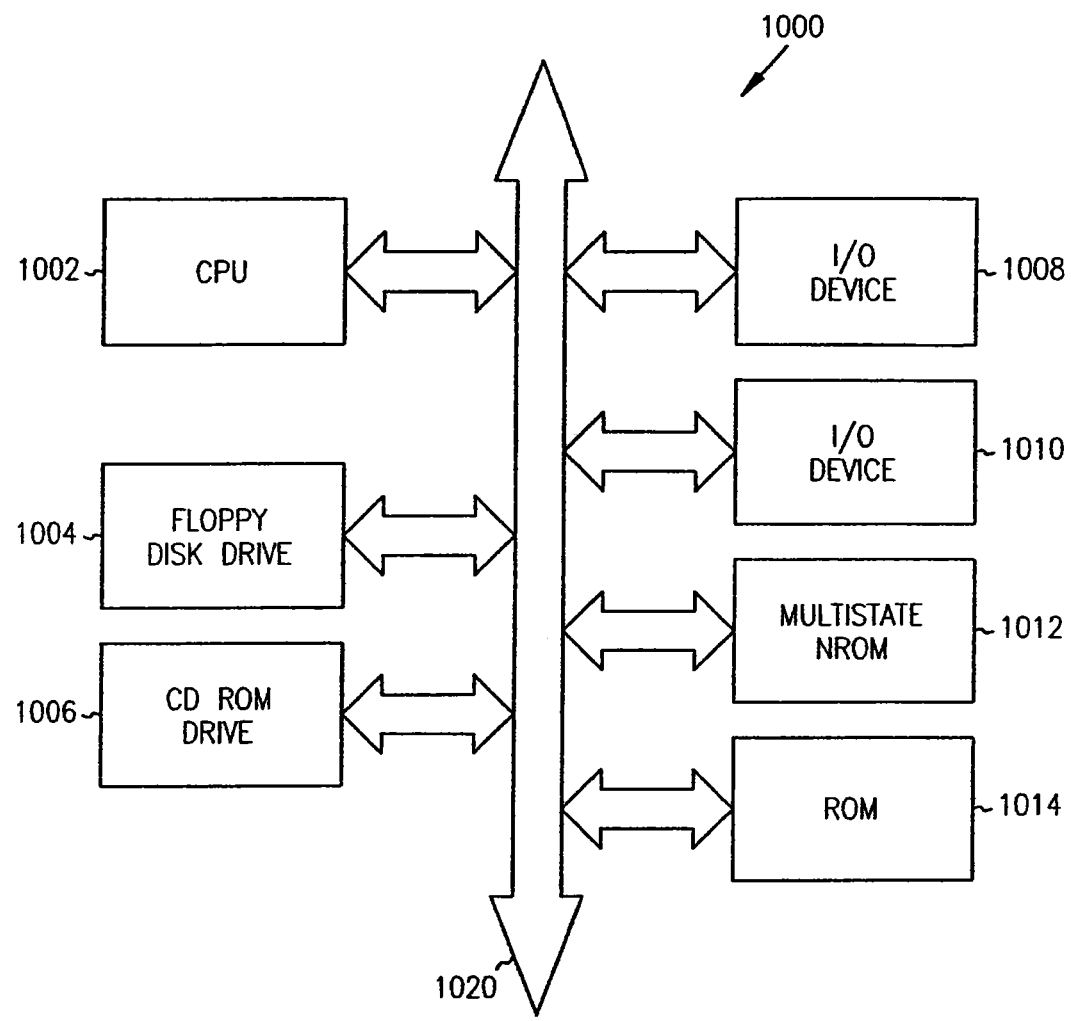
FIG. 18 is a block diagram of an electrical system, or processor-based system, utilizing a multistate cell constructed in accordance with the present invention.

FIG. 18 is a block diagram of an electrical system, or processor-based system, 1000 utilizing multistate memory cells 1012 constructed in accordance with the present invention. That is, the multistate memory cells 1012 utilizes the modified DRAM cell as explained and described in detail in connection with FIGS. 2-4. The processor-based system 1000 may be a computer system, a process control system or any other system employing a processor and associated memory. The system 1000 includes a central processing unit (CPU) 1002, e.g., a microprocessor, that communicates with the multistate memory 1012 and an I/O device 1008 over a bus 1020. It must be noted that the bus 1020 may be a series of buses and bridges commonly used in a processor-based system, but for convenience purposes only, the bus 1020 has been illustrated as a single bus. A second I/O device 1010 is illustrated, but is not necessary to practice the invention. The processor-based system 1000 can also includes read-only memory (ROM) 1014 and may include peripheral devices such as a floppy disk drive 1004 and a compact disk (CD) ROM drive 1006 that also communicates with the CPU 1002 over the bus 1020 as is well known in the art.

It will be appreciated by those skilled in the art that additional circuitry and control signals can be provided, and that the memory device 1000 has been simplified to help focus on the invention. At least one of the multistate cell in NROM 1012 includes a programmed MOSFET having a charge trapped in the gate insulator adjacent to a first source/drain region, or source region, such that the channel region has a first voltage threshold region (Vt1) and a second voltage threshold region (Vt2), where Vt2 is greater than Vt1, and Vt2 is adjacent the source region such that the programmed MOSFET operates at reduced drain source current.

It will be understood that the embodiment shown in FIG. 18 illustrates an embodiment for electronic system circuitry in which the novel memory cells of the present invention are used. The illustration of system 1000, as shown in FIG. 18, is intended to provide a general understanding of one application for the structure and circuitry of the present invention, and is not intended to serve as a complete description of all the elements and features of an electronic system using the novel memory cell structures. Further, the invention is equally applicable to any size and type of memory device 1000 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

Utilization of a modification of well established DRAM technology and arrays will serve to afford an inexpensive memory device which can be regarded as disposable if the information is later transferred to another medium, for instance CDROM's. The high density of DRAM array structures will afford the storage of a large volume of digital data or images at a very low cost per bit. There are many applications where the data need only be written a limited number of times, the low cost of these memories will make it more efficient to just utilize a new memory array, and dispose of the old memory array, rather than trying to erase and reuse these arrays as is done with current flash memories. The novel multistate cells can be used in a DRAM like array. Two transistors can occupy an area of 4F squared (F=the minimum lithographic feature size) when viewed from above, or each memory cell consisting of one transistor utilizing an area of 2F squared. Each such transistor can now, however, store many bits so the data storage density is much higher than one bit for each 1F squared unit area. Using a reference or dummy cell for each memory transistor where the reference transistor is in close proximity, e.g., the embodiment shown in FIGS. 16A and 16B vs. that shown in FIG. 12, results in better matching characteristics of transistors, but a lower memory density.

In a first aspect, the present invention includes a method for making an array of memory cells configured to store at least one bit per one $F^2$. The method includes doping a first region of a semiconductor substrate and incising the substrate to provide an array of substantially vertical edge surfaces. Pairs of the edge surfaces face one another and are spaced apart a distance equal to one half of a pitch of the array of edges. The method also includes doping second regions between the pairs of edge surfaces and disposing respective structures each providing an electronic memory function on at least some respective ones of the edge surfaces. The method also includes establishing electrical contacts to the first and second regions.

In another aspect, the present invention includes a method for making an array of memory cells configured to store at least one bit per one $F^2$. The method includes disposing substantially vertical structures providing an electronic memory function spaced apart a distance equal to one half of a minimum pitch of the array and establishing electrical contacts to memory cells including the vertical structures.

In a further aspect, the present invention includes an array of memory cells configured to store at least one bit per one $F^2$ formed using vertical structures providing an electronic memory function spaced apart a distance equal to one half of a minimum pitch of the array. The structures providing the electronic memory function are configured to store more than one bit per gate. The array also includes electrical contacts to the memory cells including the vertical structures.

In a still further aspect, the present invention includes a vertical metal oxide semiconductor field effect transistor (MOSFET) extending outwardly from a substrate, the MOSFET having a first source/drain region, a second source/drain region, a channel region between the first and the second source/drain regions, and a gate separated from the channel region by a gate insulator. A sourceline is formed in a trench adjacent to the vertical MOSFET, wherein the first source/drain region is coupled to the sourceline. A transmission line is coupled to the second source/drain region. The can be programmed MOSFET to have one of a number of charge levels trapped in the gate insulator adjacent to the first source/drain region such that the channel region has a first voltage threshold region (Vt1) and a second voltage threshold region (Vt2) and such that the programmed MOSFET operates at reduced drain source current.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory device, the memory device including a memory cell comprising:
   a first source/drain region at a top of a pillar;
   a second source/drain region at a bottom of a trench adjacent to the pillar;
   a channel region in the pillar between the first and the second source/drain regions;
   a gate in the trench wherein the gate is shared with an adjacent memory cell having a first source/drain region and a channel region in another pillar adjacent to the trench; and
   a gate insulator between the channel region and the gate in the trench wherein the gate insulator comprises a first region adjacent to the first source/drain region and a second region adjacent to the channel region, and wherein the first region is thicker than the second region.

2. The memory device of claim 1, further comprising a dielectric cap over the first source/drain region.

3. The memory device of claim 2, wherein the dielectric cap comprises silicon nitride.

4. The memory device of claim 1, wherein the channel region is in a vertical sidewall of the pillar.

5. The memory device of claim 1, further comprising a floating gate between the gate insulator and the gate in the trench.

6. The memory device of claim 1, wherein, when programmed, the memory cell is configured to trap a charge in the gate insulator adjacent one of the source/drain regions, such that the channel region has a first voltage threshold region (Vt1) and a second voltage threshold region (Vt2) in the channel region.

7. The memory device of claim 1, further comprising a patterned conductive layer extending upward that establishes electrical communication between an upper conductive layer formed above a plurality of memory cells comprising the memory cell and selected portions of the first source/drain region of each of the plurality of memory cells.

8. The memory device of claim 1, wherein the gate insulator comprises one of wet silicon oxide, silicon nitride, silicon oxynitride, silicon rich oxide, aluminum oxide, composite layers of these insulators such as oxide and then silicon nitride, or oxide and then aluminum oxide, or multiple layers as oxide-nitride-oxide, silicon rich aluminum oxide insulators, silicon rich oxides with inclusions of nanoparticles of silicon, silicon oxide insulators with inclusions of nanoparticles of silicon carbide, or silicon oxycarbide insulators; or a composite layer of one of oxide-aluminum oxide-oxide, or oxide-silicon oxycarbide-oxide, or a non-stoichiometric single layer of two or more materials selected from silicon, titanium, and tantalum, or oxide-nitride-oxide.

9. The memory device of claim 1, wherein the first source/drain region is coupled to a bit line.

10. The memory device of claim 1, wherein the second source/drain region is coupled to a source line.

11. The memory device of claim 1, wherein the second source/drain region comprises a source line.

12. The memory device of claim 1, wherein the physical cell size of the cell is 2F×1F.

13. The memory device of claim 1, wherein when programmed, the gate insulator adjacent to the second source/drain region is configured to trap a charge such that the channel region has a Vt1 region and a Vt2 region, where the Vt2 is greater than Vt1, and the Vt2 region is adjacent the second source/drain region.

14. A memory device, the memory device including a memory cell comprising:
    a first source/drain region in a pillar;
    a second source/drain region in a trench adjacent to the pillar;
    a channel region in the pillar between the first and the second source/drain regions;
    a gate in the trench wherein the gate is shared with an adjacent memory cell having a first source/drain region and a channel region in another pillar adjacent to the trench; and
    a gate insulator between the channel region and the gate in the trench wherein the gate insulator comprises a first region adjacent to the first source/drain region and a second region adjacent to the channel region, and wherein the first region is thicker than the second region.

15. A memory device, the memory device including a memory cell comprising:
    a vertical transistor pillar extending outwardly from a substrate, the pillar having a first source/drain region formed in a trench adjacent to the pillar wherein the trench is formed by and between the pillar and an adjacent pillar, a second source/drain region formed in the pillar, a channel region between the first and the second source/drain regions in a sidewall of the pillar, and a gate formed in the trench and separated from the channel region by a gate insulator wherein the gate is shared by an adjacent vertical transistor formed in a pillar adjacent to the trench;
    a source line formed in the substrate under the trench adjacent to the vertical transistor, wherein the first source/drain region is coupled to the source line;
    a transmission line coupled to the second source/drain region; and
    wherein the gate insulator is configured to be programmed with one of a plurality of charge levels adjacent to the first source/drain region such that the channel region has a first voltage threshold region (Vt1) and a second voltage threshold region (Vt2) in response to operation of the memory cell.

16. The memory device of claim 15, wherein the memory cell is a 1F$^2$ memory cell.

17. A memory device, the memory device including a memory cell comprising:
    a first source/drain region at a top of a pillar;
    a second source/drain region at a bottom of a trench adjacent to the pillar;
    a channel region in the pillar between the first and the second source/drain regions;
    a gate in the trench wherein the gate is shared with an adjacent memory cell having a first source/drain region and a channel region in another pillar adjacent to the trench; and
    a gate insulator, comprising ONO, between the channel region and the gate in the trench, wherein a region of an oxide layer of the ONO adjacent to the first source/drain region is thicker than a region of the oxide layer adjacent to the channel region.

18. A memory device, the memory device including a memory cell comprising:
    a first source/drain region at a top of a pillar;
    a second source/drain region at a bottom of a trench adjacent to the pillar;
    a channel region in the pillar between the first and the second source/drain regions;
    a gate in the trench wherein the gate is shared with an adjacent memory cell having a first source/drain region and a channel region in another pillar adjacent to the trench; and
    a gate insulator, comprising ONO, between the channel region and the gate in the trench, wherein there is substantially none of a nitride layer of the ONO between a bottom surface of the gate in the trench and a top surface of a substrate in the trench.

19. A memory device, the memory device including a memory cell comprising:
    a first source/drain region at a top of a pillar;
    a second source/drain region at a bottom of a trench adjacent to the pillar;
    a channel region in the pillar between the first and the second source/drain regions;
    a gate in the trench wherein the gate is shared with an adjacent memory cell having a first source/drain region and a channel region in another pillar adjacent to the trench; and
    a gate insulator, comprising ONO, between the channel region and the gate in the trench, wherein there is substantially none of a nitride layer of the ONO between a bottom surface of the gate above the pillar and a top surface of the pillar.

* * * * *